US006946984B2

(12) United States Patent
Rubin et al.

(10) Patent No.: US 6,946,984 B2
(45) Date of Patent: Sep. 20, 2005

(54) SYSTEM ON CHIP FOR DIGITAL CONTROL OF ELECTRONIC POWER DEVICES

(75) Inventors: Daniel Rubin, Ness Ziona (IL); Arie Lev, Mazkeret Batya (IL); Eytan Rabinovitz, Rishon Lezion (IL); Rafael Mogilner, Rehovot (IL)

(73) Assignee: Systel Development and Industries Ltd., Rehovot (IL)

( * ) Notice: Subject to any disclaimer, the term of this patent is extended or adjusted under 35 U.S.C. 154(b) by 105 days.

(21) Appl. No.: 10/410,362

(22) Filed: Apr. 10, 2003

(65) Prior Publication Data

US 2003/0197632 A1 Oct. 23, 2003

Related U.S. Application Data

(60) Provisional application No. 60/371,156, filed on Apr. 10, 2002, now abandoned.

(51) Int. Cl.[7] .............................................. H03M 1/00
(52) U.S. Cl. ....................................... 341/141; 341/155
(58) Field of Search ................................ 341/144, 155, 341/141, 126, 131, 156, 161, 163, 118, 150, 172

(56) References Cited

U.S. PATENT DOCUMENTS

| | | | | |
|---|---|---|---|---|
| 5,349,351 A | * | 9/1994 | Obara et al. ................ | 341/141 |
| 5,617,090 A | * | 4/1997 | Ma et al. .................... | 341/141 |
| 5,736,948 A | * | 4/1998 | Mitsuishi et al. ........... | 341/141 |
| 5,874,909 A | * | 2/1999 | Soenen et al. .............. | 341/141 |
| 5,969,654 A | * | 10/1999 | Goldin ....................... | 341/141 |
| 6,486,809 B1 | * | 11/2002 | Figoli ........................ | 341/141 |

OTHER PUBLICATIONS

XPhase™ Scalabel Multi–Phase Architecture using IR3081 & IR3086 JCs from International Rectifier Corp., 233 Kansas St. El Segundo, Ca 90245, Jan. 10, 2003.
L6561D from SGS Thomson, 1060E. Brokaw Road, San Jose, CA 95131, Jan. 2003.
IR2159 from International Rectifier Corp, no date.
The PIC16C628 microcontroller from Microchip Corp., 2355 West Chandler Blvd., Chandler, AZ 85224–6199, 1999.
On Line UPS—"DSP provide High–Speed, Cost Effective Solution" PCIM magazine, Aug. 1999).
TMS320C24, TMS320F2810 & TMS320F240. from Texas Instruments (TI), 12500 TI Boulevard Dallas, TX 75243–4136 (Oct. 2001).
EP20K400FC672–1 from Altera Corp., 101 Innovation Drive San Jose, CA 95134, Mar. 2000.

* cited by examiner

Primary Examiner—Michael Tokar
Assistant Examiner—Linh Van Nguyen
(74) Attorney, Agent, or Firm—Mark M. Friedman

(57) ABSTRACT

An integrated digital controller for controlling power electronic devices and method of its use, comprises an analog-to-digital converting scanner module for scanning analog data inputs and used to create digital data correlated with the analog inputs, a loop control module operative to receive the digital data and used for controlling at least one control loop, and a pulse sequence generator (PSG) module used for generating a variety of fast, configurable, event-driven pulse sequences in cooperation with the PSG and scanner modules. The controller comprises optionally a CPU for managing various tasks and coordinate between the modules, means to create the events, and means for configuration and reconfiguration on-the-fly. The controller is preferably integrated in a semiconductor chip.

37 Claims, 17 Drawing Sheets

SYSTEM ON CHIP FOR DIGITAL CONTROL OF ELECTRONIC POWER DEVICES

CROSS REFERENCE TO RELATED APPLICATIONS

The present invention claims priority from U.S. Provisional Application No. 60/371,156, filed Apr. 10, 2002 now abandoned.

FIELD AND BACKGROUND OF THE INVENTION

The present invention relates to control of electronic devices and systems, and more specifically to methods and systems for digital control of electronic power devices and other systems that require similar control functions. Applications of power electronics include power supplies, lighting, UPS, motion control and more.

In computer power supplies, the applications include low voltage-high current and fast controlled power supplies for advanced central processing units (CPUs) and other integrated circuits (ICs) of the same technology. The state of the art topology for this application is represented by the multi-phase synchronous rectifier buck, e.g. the XPhase™ Scalable Multi-Phase Architecture using IR3081 & IR3086 ICs from International Rectifier Corp., 233 Kansas St. El Segundo, Calif. 90245.

In lighting, the applications include state of the art electronic ballasts for fluorescent lamps use, analog ICs for their power stages (PFC stage and half-bridge stage), and use of small microprocessors for digital communication of commands of the lamp. Typical implementations may use by example an IC controller such as L6561D from SGS Thomson, 1060E. Brokaw Road, San Jose, Calif. 95131 for the PFC stage, and an IC controller such as IR2159 from International Rectifier Corp. for the half-bridge stage. The PIC 16C628 microcontroller from Microchip Corp., 2355 West Chandler Blvd., Chandler, Ariz. 85224-6199, may be used for ballast management and communication.

For UPS, applications include microprocessors for ballast management and communication, (see feature article "On Line UPS"-"DSP provide High-Speed, Cost Effective Solution" PCIM magazine, August 1999) using a digital signal processor (DSP), e.g. device TMS320C24 from Texas Instruments (TI), 12500 TI Boulevard Dallas, Tex. 75243-4136 or a more advance device like TMS320F2810.

In motion control, where the main demands include high precision, complex mathematical algorithms and usually moderate speed, the state of the art controls for motors use by example a DSP such as TMS320C24 from TI. This is a fixed DSP device with embedded read only memory (ROM), instead of code-configurable with flash memory, as in devices like TMS320F240. The configurability of this DSP is limited to the specific mode of operation of its Pulse Width Modulators (PWM) outputs. An example of this is the PWM output configuration by means of a register that inserts an appropriate dead band between two PWMs, and another register that fixes the polarity of the PWM channels (Application Report SPRA289 from TI). In this case, there is no configurable event-driven pulse sequence generation by means of a look-up table (LUT). The recently launched TI TMS320F28x family is intended for multi-axis/motion-control applications. The devices comprise a module called Event Manager that allows a limited configuration of the PWM outputs. The calculations and the analog and digital measurements processing in the present invention is done independently by the custom logic. This is contrary to the approach used in TI devices in which the CPU performs these tasks. In addition, programming (definition) of the configurability in the present invention is performed without code programming, whereas in the TI devices it is done by programming of the CPU software.

The state of the art includes also some digital reconfigurable solutions, generally using field-programmable gate arrays (FPGA), together with some analog front-end analog-to-digital converters (ADC) for the analog inputs of the control mechanism. A generic programmable logic device like a FPGA device or a CPLDs, by example EP20K400FC672-1 from Altera Corp., 101 Innovation Drive San Jose, Calif. 95134, targets the general case and sacrifices performance and area in order to achieve a high degree of flexibility. This extreme level of flexibility is unnecessary and would result in significant silicon area (high cost), delay (latency), and high power consumption.

The need for custom fabrication provides the opportunity to tailor a reconfigurable hardware to the intended uses and applications of a system on chip (SoC), instead of the high cost of development and the long time-to-market characterized by the application of a proprietary ASIC solution.

To summarize, at present, both analog and digital control solutions suffer from a number of disadvantages. Analog control solutions show degradation due to component aging and component temperature drift. They require more parts (lower reliability), have limited upgrades, and present difficulty of integrator clamping and preset. Digital control solutions exhibit latency, have limited bandwidth (fBW=fS/10 to fS/6) (the maximal bandwidth of such solution cannot be more than the switching frequency divided by 6) and the design is more difficult and needs the programming of the DSP CPU core.

In view of the prior art disadvantages mentioned above, there is a widely recognized need for, and it would be highly advantageous to have an apparatus and method, that provide fully configurable digital control for various power applications, instead of proprietary ASIC solutions with their attendant disadvantages in terms of high cost and long time-to-market.

SUMMARY OF THE INVENTION

The present invention is of a versatile, on-the-fly configurable apparatus (system) and method for digital control of electronic power devices, and of other systems that require similar control functions. The apparatus will be referred to hereafter as an Integrated Digital Controller or IDC. More specifically, the present invention provides the possibility to control, by digital methods and digital means and using an "event driven engine" preferably implemented on a chip, a large and diverse number of control applications at large bandwidths and with high performance. The IDC is a re-configurable hardware customized for a particular application domain: the, control of electronic devices and systems. This re-configurability involves the silicon hardware (custom logic) architecture and the creation of control functions/algorithms, as well as their further adaptation to the particular end-product specifications by modification of additional constants. In contrast with previous digital solutions, the method applied in the IDC uses simple configuration of the silicon custom logic without a need for code programming.

The IDC is comprised of a number of modules that serve as the building blocks of the control system, and is preferably implemented in a single semiconductor chip. The digital control which is at the heart of the IDC is facilitated by a digital processor module that is managing the tasks and performs general purpose calculations; a Pulse Sequence Generator (hereinafter PSG) module having one or more event-driven PSG channels, which are a generalized form of PWMs; and a "loop control" or Proportional, Integral, Differential, Feed Forward (hereinafter PIDF) module with one or more PIDF channels (one per control loop), each having some or all of the PIDF gain elements that perform the specific control task. An analog-to-digital converting scanning engine (referred to hereafter as ADC Scanner) and other elements such as Digital-to-Analog converters (hereinafter DAC), a memory connected to the digital processor, and a Digital Phase Locked Loop (hereinafter DPLL) used for synchronizing the power processing to the utility power line, etc., as more fully described below, allow to indefinitely expand the IDC to control as many elements as physically conceivable and practical. A key feature of the IDC is that each control loop may be independent of the others, and is working in parallel at the basic clock rate of the device. This feature produces performance figures that are tens of times better than those of the equivalent state of the art DSPs, as presented for example in the TI literature mentioned above.

The programmability/configurability of the IDC is achieved by choosing a set of constants and inserting them in the memory to achieve both the connectivity between the different modules and elements comprised in the Custom Logic as mentioned below in the preferred embodiments section, and the programmability/configurability of the device to a multitude of applications, as more fully described below. This feature is also a major element of this invention.

The invention includes a number of elements and features/attributes, described in detail below, with particular emphasis on the overall architecture, and the various modules, i.e. the PSG, the PIDF, the ADC Scanner, an "Analog Compare" module that includes the DAC, and the DPLL. The invention further includes elements and features regarding communications (e.g. power line carrier modem, RF interface, full duplex UART port, etc.), interconnectivity between elements and with the outside world, and programmability and configurability aspects.

By providing a new architecture, and by transferring to firmware control functions that are in the present state of the art performed by DSPs via software, the present invention achieves very large improvements in bandwidth, ease of implementation to different applications by modifying a set of constants instead of rewriting the software, and other advantageous features that will be clear to those knowledgeable in the art.

The firmware/custom logic architecture is such that all kinds of mechanisms such as PWM and/or FM (Frequency Modulation), and/or PSM (Phase Shift Modulation) can be created by an event-driven PSG. The implementation of such options is straightforward to the designer of a new application, by defining a set of constants only. Each of the resulting output pulse sequences can be independent or dependent to others, and such interrelation can be modified on-the-fly.

The PIDF processing engine allows defining any control loop that includes position control and velocity control. Feed-forward and multi-loop capabilities can be implemented for advanced sophisticated control loops. Each such loop is independent and can be driven by an adjacent loop.

The ADC Scanner is used for scanning the ADC analog inputs, uses flexible scanning sequences, and creates external events related to analog levels and/or software configurable thresholds. These events are fed to the PSG.

The DAC conversion results in the Analog Compare module are used as programmable analog voltage references for comparators that receive their reference from either the processor, one or more of the PIDF channels, one or more of the PSG channels, or a combinations thereof, to perform analog external events (for example current mode control application). The comparison is made against an external analog signal.

The digital PLL (DPLL) module is aimed to detect the mains zero cross for general synchronization of the system elements installed on the power line. The DPLL also provides programmable accurate time marks within a sine cycle. This feature is of utmost importance in UPS control applications. This represents a very accurate synchronization and time marking signal for all practical purposes.

The interrelation between the different elements above allows designing extremely sophisticated control systems with great ease. The number of loops implemented is not limited and is driven by the problem to be solved. In a present application there are 11 loops. An additional feature inherent to the device and which enhances its functionality is the availability on-chip of a bi-directional embedded communication modem that has diverse communication, selectable on-the-fly physical layers such as: Spread Spectrum Power Line Carrier (PLC) as well as RF (for wireless communication), wire communication such as RS-485, CAN and others. The combination on one chip of a high performance digital controller that can be programmable by a set of constants, and a versatile communication PLC, wire modem and RF, provides extremely wide applications at very low cost.

The above mechanisms are preferably implemented in a silicon chip that includes also a CPU and a flash memory to manage and configure all the IDC, functions. The IDC thus represents a "system-on-chip".

According to the present invention there is provided an integrated digital controller (IDC) for controlling electronic devices, comprising an ADC Scanner module configured to flexibly scan analog data inputs and to receive input signals from analog inputs, the ADC Scanner module operative to create digital data outputs correlated with the input signals, a loop control module for controlling at least one control loop, the loop control module operative to receive the digital data outputs from the ADC Scanner; and a pulse sequence generator (PSG) module used for generating configurable event-driven pulse sequences solely defined by a set of configurable constants, the PSG module operative to exchange information with the loop control module and the Scanner module, whereby the integrated digital controller has an architecture that provides practically unlimited control loops that can be implemented in firmware by custom logic, and provides rapid, configurable pulse sequences for a variety of electronic control applications.

According to one feature of the IDC of the present invention, the ADC Scanner module includes at least one configurable and flexible scanning engine responsive to conversion requests and operative to define the sequence of analog-to-digital conversion of the analog inputs, at least one analog multiplexer used to select at least one of the analog inputs using the scanning engine, and at least one analog-to-digital converter for converting the at least one analog input into digital data outputs.

According to another feature of the IDC of the present invention, each loop control module includes at least one loop control channel.

According to yet another feature of the IDC of the present invention, each loop control channel includes at least one proportional gain element and at least one integral gain element, the at least one proportional and integral elements used to provide a result correlated with at least one control function.

According to yet another feature of the IDC of the present invention, at least one of the loop control channels further includes at least one additional element selected from the group consisting of at least one differential gain element, at least one feed-forward element, and a combination thereof, the at least one additional element acting coordinately with the at least one proportional gain element and at least one integral gain element to provide an enhanced control function.

According to yet another feature of the IDC of the present invention, the loop control module can be reconfigured on-the-fly.

According to yet another feature of the IDC of the present invention, the pulse sequence generator module includes at least one PSG channel.

According to yet another feature of the IDC of the present invention, each PSG channel includes at least one state machine for generating at least one of the event-driven pulse sequences, the state machine further including at least one configurable look-up-table for defining the at least one pulse sequence, and a timer for creating at least one internal event used in the generation.

According to yet another feature of the IDC of the present invention, the IDC is implemented in a semiconductor chip.

According to the present invention, the IDC further comprises an analog compare module for creating at least one external event to be fed to the PSG module.

According to the present invention, the IDC further comprises at least one digital phase locked loop for synchronizing a module selected from the group consisting of the PSG module and the loop control module to the external event.

According to the present invention, the IDC further comprises a central processing unit (CPU) used for configuring the controller at initialization and on-the-fly and for managing the controller and for performing control functions in cooperation with the loop control module and the pulse sequence generator, the CPU connected to the loop control module and the PSG module by an external data bus and an external address bus.

According to the present invention, the IDC further comprises a communication module for a power line carrier (PLC) communication and for radio frequency (RF) communication, the communication module exchanging information with the ADC Scanner and the CPU.

According to the present invention there is provided a method for digitally controlling electronic power applications comprising the steps of providing an integrated digital controller operative to provide configurable, practically unlimited control loops that can be implemented in firmware by custom logic, the controller including at least an ADC Scanner module configured to flexibly scan analog inputs and to receive input signals from the analog inputs and, the ADC Scanner module further configured to create digital data outputs correlated with the input signals, a pulse sequence generator (PSG) module used for generating configurable event-driven pulse sequences solely defined by a set of configurable constants, and a loop control module for controlling at least one control loop, the loop control module configured to receive the digital data outputs from the ADC Scanner and operative to exchange information with the pulse sequence generator; and creating rapid, re-configurable pulse sequences for a variety of electronic control applications using the integrated digital controller.

According to the present invention there is provided an integrated ADC Scanner configured to flexibly scan analog data inputs and to receive input signals from the analog inputs, the ADC Scanner further configured to create digital data outputs correlated with the input signals, comprising at least one configurable and flexible scanning engine responsive to conversion requests and operative to define the sequence of ADC conversion of the analog inputs, at least one analog multiplexer used to select at least one of the analog inputs using the scanning engine, and at least one analog-to-digital converter for converting the at least one analog input into the digital data outputs.

According to the present invention there is provided an integrated loop controller having at least one loop control channel and operative to receive digital data inputs, comprising at least one proportional gain element, at least one integral gain element, used cooperatively with the at least one proportional gain element to provide a result correlated with at least one control function, and at least one additional element selected from the group consisting of at least one differential gain element, at least one feed-forward element, and a combination thereof, the at least one additional element acting coordinately with the at least one proportional gain element and at least one integral gain element to provide an enhanced control function.

According to the present invention there is provided an integrated pulse sequence generator comprising means to receive events input information; at least one channel having at least one state machine for generating event-driven pulse sequences in response to the input information; and means to output the event driven pulse sequences and other information, whereby the pulse sequences are solely defined by a set of configurable constants.

According to the present invention there is provided an integrated digital phase locked loop that provides zero crossing information of the mains voltage in order to serve as a synchronization signal to a number of devices that are connected to the mains.

According to the present invention there is provided a digital phase locked loop (DPLL) for synchronizing devices connected to a mains bus comprising a digitally implemented quasi VCO that includes a cycle counter that emulates the VCO function and a comparator that compares actual counts to a VCO value and resets the value; and a quadrature-phase detector connected to an input line of the mains bus and receiving feedback from the cycle counter to compare between the phase of the frequencies of the line and the quasi VCO.

According to the present invention, the DPLL further comprises a proportional gain block and an integral gain blocks operating cooperatively to receive a phase error signal from the quadrature phase detector, the summation of the signal generating the VCO value, a phase frequency detector connected to the input line and receiving feedback from the cycle counter to compare between the frequency phases and the line frequencies and the quasi VCO at an initial lock-in process, a lock-in detector that receives error data resulting from the comparison of the outputs of the phase frequency and the quadrature detectors along several line cycles for the purpose of filtering to verify the lock-in, and a cycle slice generator that slices the line voltage wave cycle in order to provide timing marking for parameter measurements related to the line, whereby the elements of the DPLL provide a synchronization signal under a noisy power line environment and implement the PLL function in custom logic for price optimization.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of system and method for digital control of electronic power devices and other systems that require similar control functions. More specifically, the present invention provides the possibility to control, by digital methods and digital means, a large and diverse number of control applications in power systems, at large bandwidths and with high performance. The principles and operation of the system and method of the present invention, including those of each of its elements, may be better understood with reference to the drawings and the, accompanying description.

Figure 1:
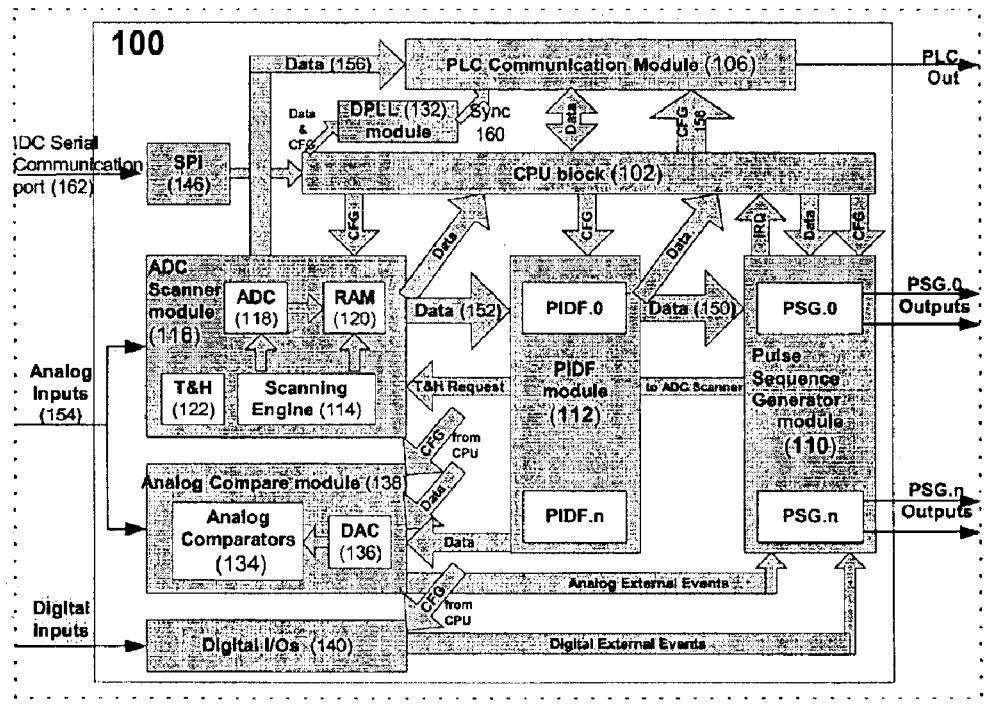
FIG. 1 shows a block diagram of a preferred embodiment of the integrated digital of the present invention.

FIG. 1 shows a block diagram of a preferred embodiment of an IDC 100. IDC 100 has an overall architecture comprising a controller/processor (CPU) 102 that performs the general management of low frequency tasks; a PSG module 110 including one or more PSG.i channels, a PIDF module 112 including one or more PIDF.i channels; and an ADC Scanner module 116 (referred to hereafter simply as C Scanner), that includes a scanning engine 114, an analog to digital converter (ADC) cell 118, a memory (preferably RAM) 120, and track and hold (T&H) devices 122. IDC 100 further comprises an optional PLC Communication module 106, an optional DPLL module 132, and an optional Analog Compare module 138 that includes analog comparators 134 and a DAC (digital to analog converter) cell 136. PSG module 110, PIDF module 112, scanning engine 114, DPLL module 132, and PLC Communication module 106 can be grouped under the general title of "Custom Logic", mentioned above. The modules and their main elements are described in more detail below.

This architecture facilitates the implementation of an unlimited (architecture-wise) number of co-processing engines that allow solution of various control problems. Such problems require typically a large numbers of elements to be controlled at large control bandwidths. The problems typically have mutual interrelation constraints. In the system of the present invention, the control functions are mainly carried out by digital hardware logic circuitry. Advantageously, the architecture of the present invention allows generating a vast variety of applications for different product lines such as UPS, Power Supplies, Electronic Ballasts (single or multiple fixtures), Electrical Motor Controllers, etc. Advantageously yet, and in contrast with present state of the art solutions, the definition of the applications is straightforward by definition of LUTs and an array of constants. Moreover, the architecture provides flexibility and configurability for high-speed and/or high capacity power control.

Returning now to FIG. 1, in a more detailed view of the modules, the PSG is an event driven machine, using internal and external events to generate a required "scenario" (to be defined below). It also provides fast protection that is needed to protect the power switches of the application device. In the preferred embodiment, as mentioned, PSG module 110 includes one or more "i" of channels 110-i which may be similar but not necessarily identical, i.e. may include different channel elements. Each of the PSG channels generates pulse sequences required to control power switches of a power device application (not shown). PSG module 110 is configured by CPU 102, which may also be the source of data for the PSG module. At configured events, the PSG module sends an IRQ (Interrupt request) to CPU 102. PSG module 110 may have one or more PSG channels. PSG module 110 also provides T&H (Track & Hold) requests to ADC Scanner 116.

As mentioned, IDC 100 preferably further comprises PIDF module 112, which includes a plurality "i" of PIDF channels 112-i. Channels 112-i may be similar but not necessarily identical, i.e. may include different channel elements. Each PIDF channel 112-i is a control unit that performs the numeric calculations required to close a digital control loop. The calculations use normally variables such as a reference signal (generally invoked by a processor) and various feedback signals fed from the controlled circuit of the application (external feedback signals) through the ADC Scanner (see below). The output of PIDF module 112 is Data 150 sent to PSG module 110. The PIDF is also capable to perform linear interpolations in order to generate various types of controlled waveforms. Those waveforms are sent as Data 152 to Analog Compare module 138. PIDF module 112 is configured by CPU 102.

As mentioned, IDC 100 preferably further comprises ADC Scanner 116. ADC Scanner 116 uses ADC cell 118 to digitize analog feedback and analog parameters arriving from analog inputs 154 to IDC 100. Scanning engine 114 is a memory-based unit that uses an over-sampling method, thus the required signals are stored in a RAM 120 and are ready to be used by each and every PIDF channel and/or also by CPU 102. ADC Scanner module 116 is used to scan the ADC analog inputs, by using flexible scanning sequences, and is configured by CPU 102. Track & Hold devices 122 in ADC Scanner module 116 are used for time related sampling. T&H devices 122 enable analog measurements at a precise timing.

As mentioned, IDC 100 further comprises CPU (or micro controller) 102. This CPU preferably uses a flash or EE memory in case the re-configurability feature of the IDC is used, or a ROM memory in case that the reconfiguration of the IDC is not requested. The CPU can, be for example a fast 8-bit RISC unit for complex applications, or a simpler, processor. The CPU has mainly background tasks: it coordinates, monitors, protects and assists in complicated numerical calculations. It, as well as the flash memory flash or the ROM can be an external element of the control system. The CPU also controls and configures various digital I/Os using I/O ports. It functions mainly as the system manager, and it is used to configure the system, to initiate it and to set reference levels for the control loops. The control loop is structured as follows: the CPU sets a reference level that serves as a set point to the PIDF control engine. The PIDF then makes the necessary calculations using feedback signals from the application (e.g. Power Management and Power Control of a power device) that is applied through the ADC Scanner. The result of the calculation is then applied to the power switches through the PSG module. Those knowledgeable in the art will realize that a CPU in one form or another is needed to coordinate the general functions of the IDC. However, this CPU need not be incorporated together with the other essential modules in an integrated form, and may in fact be any standard processor external to an IDC semiconductor "chip" However and preferably, the CPU is optimized for the specific IDC tasks and integrated in the same chip with the other modules, even when configuration is not requested. Notwithstanding, and in the scope of the present invention, there may be cases in which there is no need for a CPU, where reconfiguration is not required, and when the application uses a single mode of operation.

As mentioned, IDC 100 includes an optional Analog Compare module 138. It includes at least one analog comparator 134 used to generate analog external events, for example the control of the inner loop of "current mode control" power supplies. The reference voltages to the at least one comparator are provided by the CPU or alternatively by the PIDF via DAC 136.

IDC 100 further includes at least one Digital I/O 140 that enables IDC 100 to function as digital inputs for digital external events for the PSG module 142. Digital I/O 140 can also be configured as a digital output of IDC 100.

As mentioned, IDC 100 further optionally comprises PLC Communication module 106 that includes both transmitter and receiver, and whose function is to download commands and data (parameters) to the IDC. Communication module 106 is optional. The PLC communication is typically by two way half duplex transmission. PLC Communication module 106 receives Data 156 from ADC Scanner module 116, and configuration CFG 158 from CPU 102. A sync signal 160 is obtained from DPLL module 132. The modem exchanges data with CPU 102 for commands, for acknowledgement and for using a protocol.

As mentioned, further and optionally, IDC 100 further comprises optional DPLL module 132, whose function is to enable jitter-free synchronization of various processes to the utilities Power Line (when the application is connected to the utilities power line and the line phase signal is used by the application for PLC communication). The DPLL module mainly serves as a packet synchronization means for the PLC communication. It also can be used for UPS and other applications. Each of the main modules of the IDC are now described in more detail.

The IDC can be implemented without the re-configurability feature. This means that after the stage of the design process of the end-product in which the constants of the scenario and the behavior of the control functions are defined, the IDC can be implemented with a ROM memory. This will be the typical case for large quantity production of chips targeted only for a specific product. Simply put, in its minimal configuration, the IDC can work without CPU and memory.

The PSG Module

PSG Module Function—General Description

Figure 2:
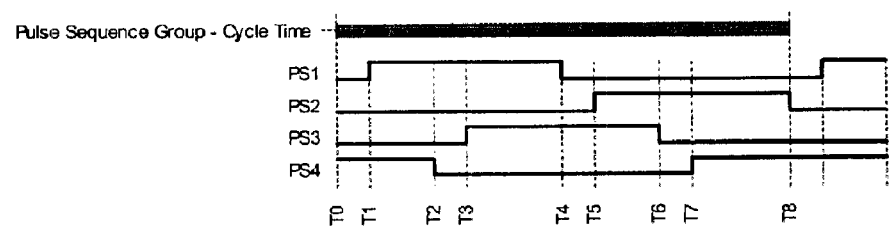
FIG. 2 is an example of a time diagram pulse sequence group according to the present invention.

The PSG module is an event driven engine generating configurable pulse sequence drive signals for a switching mode machine (power supply, motor driver, UPS, ballast, etc). The requested pulse sequence is named "Pulse Sequence Signal". Pulse sequence signals that are used to drive one power inverter with more than one power switch (Push-Pull, Half Bridge, Full Bridge, 3 Phase Bridge, Multiphase Buck, etc.) are given the name "Pulse Sequence Group". Thus, a pulse sequence group is comprised of several pulse sequence signals whose transition timing is interdependent, and which have a common Cycle Time. FIG. 2 shows an example of such a pulse sequence group. In FIG. 2, PS1 to PS4 are 4 pulse sequence signals and are also pulse sequence groups. The interval T0 to T8 is the cycle time of the pulse sequence group and of each signal of the group (PS1 to PS4).

PS1 has two transitions during its cycle time. The High level of PS1 starts at the T1 transition and stops at the T4 transition. The interval time [T1 to T4] is called a segment (or pulse sequence segment) of PS1. The Low level of PS1 is combined of two segments [T0–T1] and [T4–T8]. The Dead Time between PS1 and PS2 is segment [T4–T5]. The Delay Time of PS1 is segment [T0–T1] (also called Dead Time between PS2 and PS1). The Delay Time of PS3 is segment [T0–T3]. A pulse sequence segment (or simply "segment") can be any interval between any two transitions in the pulse sequence group. Parts of the segments are dictated by the PSG Module.

Event Driven Machine Principle Method

Each transition in the pulse sequence signal is dictated by an "external event" or an "internal event". The external event source is outside the IDC and is received typically from a power section. Examples for external events are: voltage zero cross, current zero cross, current threshold cross in current mode control, etc. An external event dictates the end of a segment according to the IDC input signal. Internal events are generated inside the IDC and define the duration time of segments in a pulse sequence signal or pulse sequence group.

An internal event dictates the end of the segments that have constant value or calculated value. For example, the PIDF module dictates the segment that has a calculated value (can also be called "loop controlled" value). The CPU typically dictates the segment that has a constant value (the value can be changed on-the-fly) by a configurable state machine. Typically, an internal event is generated by digital comparison of timer value to digital data, and derived from a digital comparator. The internal event is generated when the timer value exceeds the value of the digital data. The segment value (duration time) is equal to the division of the digital data by the timer clock frequency.

The programmability of the PSG module structure enables to control the timer operation in relation to the requested pulse sequence group. Each pulse sequence signal is generated includes one or more look up tables (LUTs) for its configuration. Each row (address) of a LUT defines one state of the configurable state machine and generates one segment of the pulse sequence signal. Consecutive segments are generated by consecutive rows (addresses). Therefore, the number of the segments is equal to the number of the states. The maximum possible number of segments in a pulse sequence signal is equal to the number of rows in the LUT (for example, in a preferred embodiment of the IDC, the number is 16). Table 1 describes one such row structure.

TABLE 1

| Bit group function | Maximum possible number of bits are theoretically unlimited and equal to: | Number of bits in IDC2000 |
|---|---|---|
| 1. Dictating a segment level of the pulse sequence signal | Number of pulse sequence signals controlled by the LUT. | 1 |
| 2. Selecting an internal event for incrementing to next state (also row (address) and segment) | Round(log([number of Internal Events],2),0) | 6 |
| 3. Internal event polarity (rise/fall) | 1 | 0 |
| 4. Selecting an external event for incrementing to next state (also row (address) and segment) | Round(log([number of external events],2),0) | 5 |
| 5. External event polarity (rise/fall) | 1 | 0 |
| 6. Dictating zero value (reset) to the timer. | Number of timer controlled by the LUT | 2 |
| 7. Enabling counting of the timer. | Number of timer controlled by the LUT | 2 |
| 8. Defining count direction of the timer. | Number of timer controlled by the LUT | 0 (up counter) |
| 9. Requesting T&H for requested analog input | Round(log([number of analog inputs],2),0) | 1 |
| 10. Defining the last state (also row (address) and segment) of the pulse sequence signal | 1 | 1 |
| 11. Selecting a data source to be compared with the timer | Round (log([number of the data sources],2),0) × [number of timers controlled by the LUT] | 0 |
| 12. Other functions that need to be synchronized to pulse sequence signal - segments. | Many possibilities | 0 |

PSG Module Description

Figure 3:
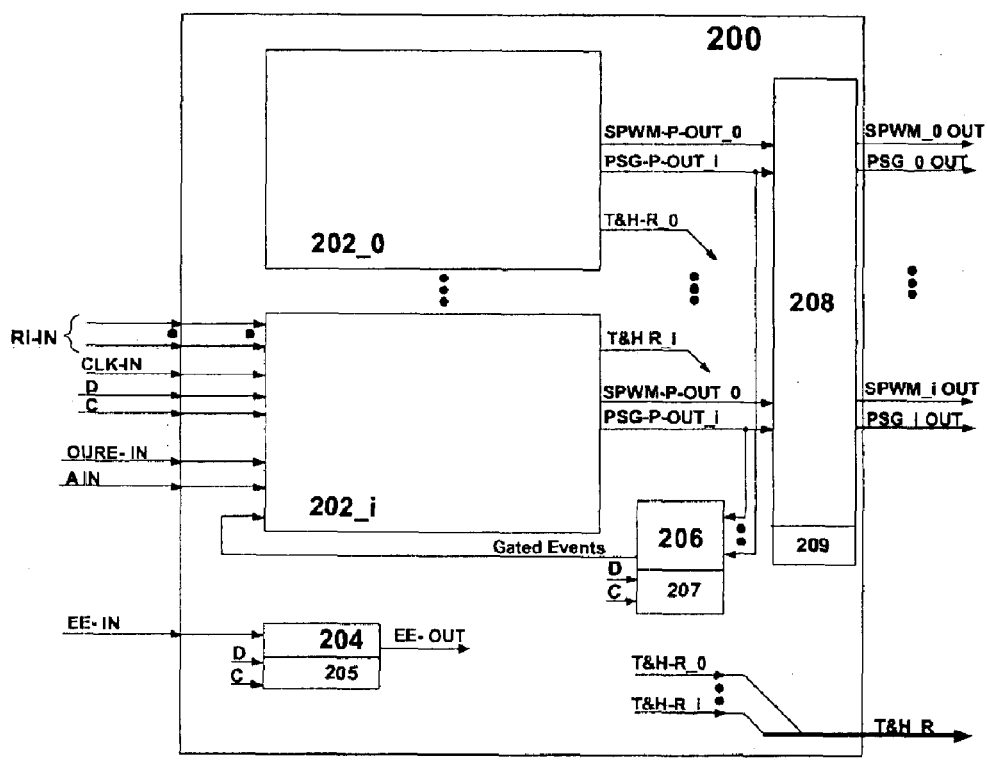
FIG. 3 shows a block diagram of a preferred embodiment of the PSG module of the present invention.

FIG. 3 shows a block diagram of a preferred embodiment of a PSG module 200 according to the present invention. PSG 200 is shown to include 11 PSG channels 202, which may be identical or non-identical. This number is not meant to be limiting. In general, the number of PSG channels can be unlimited.

The PSG module preferably includes the following inputs: a master clock CLK-IN (e.g. 192 Mhz clock), a PIDF module results data Ri-IN (e.g. 11 buses×12 bits, with i defined above), a CPU external address bus C (e.g. 16 bits), a CPU external data bus D (e.g. 16 bits), a plurality (e.g. 14) of external events EE-IN, an out of range event OURE-IN, and an analog input number AIN of the ADC Scanner output data. The Master Clock frequency defines the modulation resolution of the pulse sequence. In a preferred embodiment of the IDC, the maximum modulation resolution is 5.2 nSec ($1/192$ Mhz=5.2 nSec). Ri-IN defines the duration time for controlled segments that form the pulse sequence. Examples for such segments are: cycle time in FM, ON pulse width in PWM, OFF time leading edge in PWM, delay time between two dependent pulse sequence signals in a phase control application, etc. Dependent pulse sequence signals are typically driving a group of power switches belonging to the same power inverter. In the preferred embodiment of the IDC presented here, the PSG module receives 11 Digital Data 12 bits signals from a channel of the PIDF module.

In the generic case, the possible number of digital data signals received from the PIDF module is equal to the number of PIDF module data outputs, since a PIDF channel may have more than one "Result Output" the possible number is higher than the number of the PIDF channels).

The PSG module receives CPU data via CPU the external data and address buses (C, D). The CPU data is used to load the PSG configuration registers and data registers. In the general case it is possible also to receive data also directly from the ADC Scanner.

An external event is received from the IDC digital input (e.g. via a digital Schmidt Trigger) or from the Analog Compare module An external event defines the transition moment in a pulse sequence. In one example, a drain voltage zero cross generates an external event to dictate the start moment of the pulse sequence, i.e. the "ON" time, in critical mode PFC boost topology. In another example, the controlled loop "PIDF result" is compared to the flyback power switch current in current mode, and generates an external signal to dictate the end of the pulse sequence, i.e. the "OFF" time.

An out of range event OURE-IN is received from the ADC Scanner The related AIN is received from the ADC Scanner (5 bits) at the same moment. These two inputs are used by a protection block (see description of FIG. 4 below).

The PSG module preferably further includes "i" PSG_i OUT outputs ("i" representing the order number of the PSG Channel), and SPWM_i OUT outputs PSG_i OUT is typically used for a pulse sequence (pulse sequential drive signal) but it can be used also as a CPU Digital I/O port. SPWM_i OUT is used as a complementary pulse sequence (complementary pulse sequential drive signal) for a PSG_i channel output typically required in half-bridge and push-pull circuits. In the general case, the number of pulse sequence drive signals generated by each PSG channel is unlimited.

The PSG module preferably further includes one or more digital filters 204, a gated events logic 206, and a PSG "Other Functions" block 208. In the preferred IDC embodiment, there are 14 configurable digital filters for 14 external events. A digital filter blocks external event pulses (negative or positive), having a short duration time in order to reject noise. The configuration for a digital filter defines the maximum external event pulse width that the filter should block. The maximum pulse width is also the delay time of the filter. Each filter has a separate configuration. Preferably, there are 3 configuration bits for each 1 filter. The maximum pulse width and delay time is equal to $2^3$ configuration bits value. Of course, many other filtering algorithms are possible.

Each digital filter has two types of outputs, shown as EE-OUT: an output for the rise edge of an external event, which is actually the output of the digital filter, and an output for the fall edge of the external event, which is actually the inverse of the digital filter. Therefore, for the example of 14 filters and events above, the number of filtered external-events is 28.

PSG Channel i Description

Figure 4:
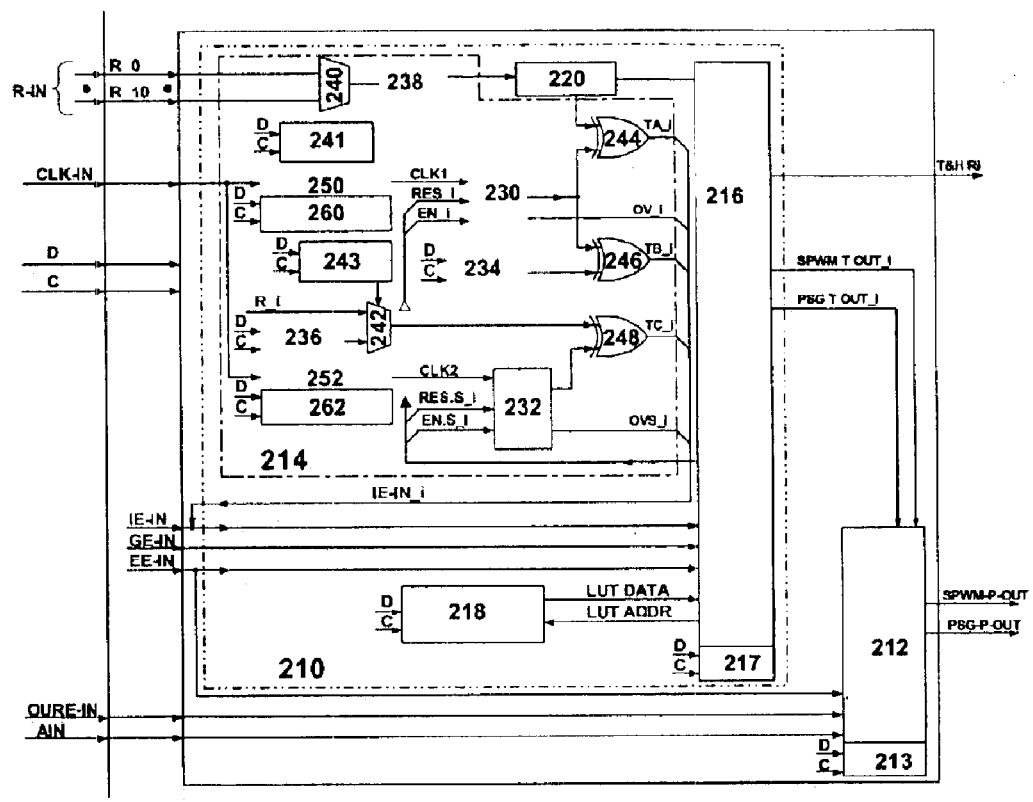
FIG. 4 shows a block diagram of a preferred embodiment of a PSG channel according to the present invention.

FIG. 4 shows a block diagram of a preferred embodiment of a PSG channel according to the present invention. Each PSG channel includes as inputs, in tandem with the PSG module inputs, a master clock CLK-IN (e.g. 192 Mhz clock), a PIDF module results data Ri-IN (e.g. 11 buses×12 bits, with i defined above), a CPU external address bus C (e.g.16 bits), and a CPU external data bus D (e.g. 16 bits), an out of range event OURE-IN, and an analog input number AIN of the ADC Scanner output data. In addition, it includes a first plurality (e.g. 28 for the example of the PSG above) of external events EE-IN, a second plurality (e.g. 55) of internal events IE-IN, and a third plurality (e.g. 6) of gated events GE-IN. The external events are obtained form digital filters 204. Each PSG channel generates preferably 5 internal events, can receive those events from all other channels. Therefore, in the particular case of 11 channels, each PSG channel receives 50 internal events from other channels. The gated events are received from a gated event logic block 206.

Each PSG channel includes as outputs PSG Protected Out_i (referred to as PSG-P-OUT_i) ("i" for the order number of the PSG Channel) and a SPWM Protected Out_i (referred to as SPWM-P-OUT_i). PSG-P-OUT_i is the pulse sequence signal generated by a timing logic block TI 210, and which passes through a PSG_i protection logic 212. SPWM-P-OUT_i is an additional pulse sequence signal generated by TI 210 (passing also via protection logic 212).

TI 210 is a configurable pulse sequence generator driven by external events and by internal events. Its inputs include all the inputs of the PSG channel listed above. Its outputs include a PSG Timing Out_i (referred to as PSG-T-OUT_i), a SPWM Timing Out_i (referred to as SPWM-P-OUT_i), and the PSG channel internal events, which are used to generate some of the configurable pulse sequence signals. TI 210 includes an event generator 214, a PSG state machine logic 216, a state machine configurable LUG 218 (LUG_i), and a dithering logic 220. Event generator 214 generates the internal events mentioned, above (5 in the example). Each internal event is then used by logic 216 to generate a transition at the occurrence moment of the event, in its pulse sequence signals (PSG-T-OUT or SPWM-T-OUT, see below). Event generator 214 includes the following, elements: a Timer-i 230, a Timer.s_i 232, a CPU Data1 234, a CPU Data2 236, a PIDF Data register 238, two multiplexers (MUX) 240 and 242, 3 comparators 244, 246, 248, and two prescalers 250 and 252. In the particular example of 5 internal events, the event generated by generator 214 are marked TA_i, TB_i, TC_i, OV i, and OVS_i. Each of these internal events can be selected by any PSG State Machine using its configurable LUT 218.

TA_i is generated by comparison of Timer_i 230 value (12 bits) to PIDF Data_i 238 (12 bits register) by a comparator.A_i 244. If ([Timer_i value]<[PIDF Data_i]) TA_i=0; else TA_i=1; The value of PIDF Data_i 238 defines the duration time of the loop controlled segment(s) in the pulse sequence signal. MUX 240 selects (by configuration register 241) one of the PIDF results (R0 to R10) to be loaded into PIDF Data_i 238. PIDF Data_i output passes via dithering logic_i 220 into comparator.A_i 244.

TB_i is generated by comparison of Timer_i 230 value (12 bits) to CPU Data1_i 234 (12 bits Register) by a comparator.B_i 246. If ([Timer_i value]<[CPU Data1_i]) TB_i=0; else TB_i=1; The value of CPU Data1_i 234 typically defines the duration time of constant value segment (s) in the pulse sequence signal, but also can define loop controlled segment(s) with slow dynamics, where the data is calculated by the CPU.

TC_i is generated by comparison of Timer.S_i 232 value (12 bits) to MUX 242 output (12 bits) by a comparator.C_i 248. If ([Timer.S_i value]<[MUX 242 Output]) TC_i=0; else TC_i=1; MUX 242 selects (by configuration bit 243) between Ri (PIDF Results of PIDF channel i) and CPU Data2_i 236. The value of Ri defines the duration time of loop controlled segment(s) in the pulse sequence signal. The value of CPU Data2_i 236 typically defines duration time of a constant value segment(s) in the pulse sequence signal, but also can define loop controlled segment(s) with slow dynamics, where the data is calculated by the CPU. TC_i also dictates the end of On time (pulse width) of the SPWM-T-OUT _i) signal when SPWM T OUT_i output is configured as PWM mode.

OV_i is generated by over flow of Timer_i 230. If ([Timer_i Data]=0xFFF) OV_i=1; else OV_i=0; OV_i typically dictates the cycle end of the pulse sequence signal or of the pulse sequence group when: [the cycle time]= 4096*(1/[clock frequency of Timer_i]).

OVS_i is generated by Over flow of Timer.S_i 232. If ([Timer.S_i Data]=0xFFF OVS_i=1; else OVS_i=0; OVS_i typically dictates the cycle end, of the pulse sequence signal or of the pulse sequence group when: [the cycle time]=4096*(1/[clock frequency of Timer.S_i]). OVS_i also dictates the end of the cycle (period time) of SPWM-T-OUT_i signal when SPWM-T-OUT_i output is configured as PWM mode.

Prescaler_i 250 receives the 192 Mhz clock (Main Clock) and supplies a divided clock frequency to Timer_i 230. A first configuration 260 defines the division ratio according to the following equation:

[Main Clock frequency]:[Prescaler_i 250 frequency]=2^[configuration 260].

Configuration 260 is preferably a 4 bit word and its maximum value is 10. Therefore, the minimum clock frequency supplied to Timer_i 230 is 187.5 Khz.

Prescaler.S_i 252 receives the 192 Mhz Clock (Main Clock) and supplies a divided clock frequency to Timer.S_i 232. A second configuration 262 defines the division ratio according to a similar equation:

[Main Clock frequency]:[Prescaler.S_i 252 frequency]=2^[Configuration (262)].

Configuration 262 is preferably a 4 bit word and its maximum value is 10. Therefore the minimum clock frequency supplied to Timer.S_i 232 is 187.5 Khz.

The PSG State Machine_i includes two blocks: a PSG state machine Logic_i 216, and a state machine configurable LUT_i 218. PSG state machine_i logic 216 performs the following functions: control of Timer_i 230 operation, control of Timer.S_i 232 operation, generation of the (PSG T OUT_i) signal, generation of the (SPWM T OUT_i) signals and determination of the state machine configurable LUT_i 218. PSG State Machine Logic_i 216 is received by the following inputs: Internal Events, Gated Events, External Events, and LUT_i Data (18 bits).

Each event generator 214 generates 5 internal events. Therefore the total number of the internal events is 55, generated by the 11 PSG Channels in the example. Each of the internal events can be selected to dictate the transition and/or end moment of segment of the pulse sequence signal or the pulse sequence group. The selected internal event is defined by the relevant row (address) of state machine configurable LUT_i 218.

The gated events are generated by gated event logic 206. Each gated events can be selected for dictating the transition and/or end moment of the segment of a pulse sequence signal or a pulse sequence group. The selected gated event is defined by the relevant row (address) of LUT_i 218. The method of selection is explained in detail below.

The LUT_i Data is a 18 bit row data bus of the state machine configurable LUT_i 218. The row order number is determined by LUT_i. The LUT_i address is preferably a 4 bits address bus of the LUT_i, driven by the PSG State Machine Logic_i 216. Logic_i 216 generates the following output signals according to the LUT_i Data.: a PSG T OUT_i signal, a SPWM T OUT_i signal, a RES_i (Timer_i 230 Reset) signal, an EN_i (Timer_i 230 Count Enable) signal, a RES.S_i (Timer.S_i 232 Reset) signal, an EN.S_i (Timer.S_i 232 Count Enable) signal, and a LUT_i Address (4 bits) signal. When [EN_i=1] the count is enabled. When [EN.S_i=1] the count is enabled. Each PSG channel generates one pulse sequence signal exiting via its PSG T OUT_i output toward PSG IDC OUT_i, an output port of the PSG module, via PSG Protection Logic_i 212 and PSG Other Functions block 208. These are explained later. Relating to the SPWM T OUT_i signal, there are two modes of operation related to SPWM T OUT_i: a PWM mode", and a "complementary mode". In the PWM mode, when configuration [SPWM mode bit]=0, a normal PWM signal is generated and exits from the SPWM T OUT_i output. (SPWM mode bit is one bit in configuration registers 217). In the complementary mode, when configuration [SPWM mode bit]=1, a complementary pulse sequence signal to the PSG T OUT_i signal is generated and exits from the SPWM T OUT_i output. In the complementary mode, one PSG channel drives (via the Power Driver) two power switches. The complementary mode increases the utilization of the IDC in many applications such as Half Bridge, Full Bridge (2 PSG channels), 3 Phase Bridge (2 PSG channels), Push Pull, Synchronized Buck, etc.

Figure 5:
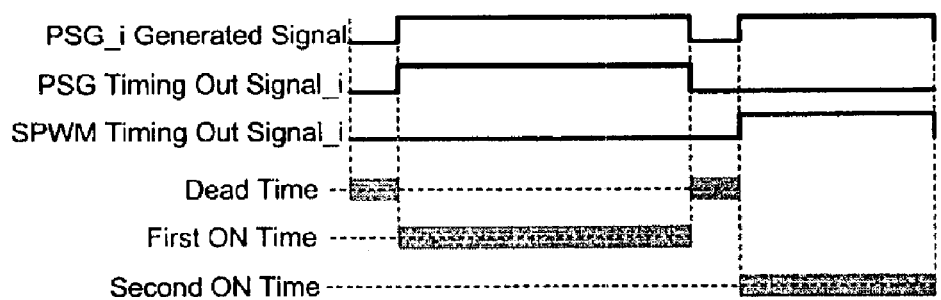
FIG. 5 is an example of a time diagram pulse sequence signal of complementary mode according to the present invention.

FIG. 5 shows an example of the complementary mode. A detailed description of the signal generation for the complementary mode appears further below.

The SPWM T OUT_i output signal exits towards SPWM OUT_i an output port of the PSG module, via the PSG Protection Logic_i 212 and PSG Other Functions block 208.

State Machine Configurable LUT i 218

LUT_i 218 is programmed by the CPU software during the initialization process (during the Machine Startup Procedure). It preferably contains 16 rows (addresses 0 to 15) in order to enable up to 16 PSG_i Scenario States. Each LUT_i Row is related to the PSG_i Scenario State. The initial value of the LUT_i address is "0", therefore, the first state is defined by LUT_i Row0. Table 2 shows LUT_i Bits Functions

TABLE 2

| LAST | b17 |
|---|---|
| ADCR | b16 |
| ExEvent EN_4 | b15 |
| ExEvent EN_3 | b14 |
| ExEvent EN_2 | b13 |
| ExEvent EN_1 | b12 |
| ExEvent EN_0 | b11 |
| IntEvent EN_5 | b10 |
| IntEvent EN_4 | b9 |
| IntEvent EN_3 | b8 |
| IntEvent EN_2 | b7 |
| IntEvent EN_1 | b6 |
| IntEvent EN_0 | b5 |
| TmrS Reset | b4 |
| TmrS Clk EN | b3 |
| Tmr Reset | b2 |
| Tmr Clk EN | b1 |
| Set/Reset | b0 |

In Table 2:
b0: bit0 dictates the level of PSG T OUT_i.
b1: bit1 dictates the level of EN_i.
b2: When bit2 = "1" it defines the reset pulse in RES_i output at the transfer moment from the present row to the next row.
b3: bit3 dictates the level of EN.S_i.
b4: When bit4 = "1" it defines the reset pulse in RES.S_i output at the transfer moment from the present row to the next row.
b5–b10: [bit 5:bit10] bits group selects Internal Events or Gated Events for incrementing LUT_i Address by "1". LUT_i Address is incremented at the event rise edge moment. If (bit17 (LAST) = 0) the LUT_i Address is incremented; else: if (bit17 = 1) the LUT_i Address is reset. If ([bit5:bit10] < 55) Internal Event is selected.; else if (61> [bit5:bit10] > 54) Gated Event is selected; else [bit11:bit15] does not select event.
b11–b15: [bit 1:bit15] bits group selects external events incrementing LUT_i Address by "1". LUT_i Address is incremented at event rise edge moment. If (bit17 (LAST) = 0) the LUT_i Address is incremented; else if (bit17 = 1) the LUT_i Address is reset. If ([bit11:bit15] < 28), External Event is selected; else if([bit11:bit15] = 28) OR1 Event is selected; (explained later); else if([bit11:bit15] = 29) AND1 Event is selected (explained later); else, [bit11:bit15] does not select event. If ([bit5:bit10] and [bit11:bit15] in the same row both select event, the first rise edge increments LUT_i Address.
b16: When bit16 = "1" it defines a T&H request pulse at the transfer moment from the present row to the next row. (see T&H request below)
b17: When bit17 = "1" the rise edge sets LUT_i Address to "0" (or to Base Address value for the Second Scenario)

Table 3 shows the order number of internal events (0 to 54) and gated events (55, 60) for selection by LUT_i 218 as internal event.

TABLE 3

| | Internal Events & Gated Events | | | | | | | |
|---|---|---|---|---|---|---|---|---|
| | LUT Bits | | | | | | |Binary| |
| Name | b10 | b9 | b8 | b7 | b6 | b5 | Symbol | Dec |
| PID Tmr Compare_0 | 0 | 0 | 0 | 0 | 0 | 0 | TA0 | 0 |
| CPU Tmr Compare_0 | 0 | 0 | 0 | 0 | 0 | 1 | TB0 | 1 |
| Tmr OverFlow_0 | 0 | 0 | 0 | 0 | 1 | 0 | OV0 | 2 |
| CPU TmrS Compare_0 | 0 | 0 | 0 | 0 | 1 | 1 | TC0 | 3 |
| TmrS OverFlow_0 | 0 | 0 | 0 | 1 | 0 | 0 | OVS0 | 4 |
| PID Tmr Compare_1 | 0 | 0 | 0 | 1 | 0 | 1 | TA1 | 5 |

TABLE 3-continued

Internal Events & Gated Events

| Name | LUT Bits | | | | | | Symbol | \|Binary Dec |
|---|---|---|---|---|---|---|---|---|
| | b10 | b9 | b8 | b7 | b6 | b5 | | |
| CPU Tmr Compare_1 | 0 | 0 | 0 | 1 | 1 | 0 | TB1 | 6 |
| Tmr OverFlow_1 | 0 | 0 | 0 | 1 | 1 | 1 | OV1 | 7 |
| CPU TmrS Compare_1 | 0 | 0 | 1 | 0 | 0 | 0 | TC1 | 8 |
| TmrS OverFlow_1 | 0 | 0 | 1 | 0 | 0 | 1 | OVS1 | 9 |
| PID Tmr Compare_2 | 0 | 0 | 1 | 0 | 1 | 0 | TA2 | 10 |
| CPU Tmr Compare_2 | 0 | 0 | 1 | 0 | 1 | 1 | TB2 | 11 |
| Tmr OverFlow_2 | 0 | 0 | 1 | 1 | 0 | 0 | OV2 | 12 |
| CPU TmrS Compare_2 | 0 | 0 | 1 | 1 | 0 | 1 | TC2 | 13 |
| TmrS OverFlow_2 | 0 | 0 | 1 | 1 | 1 | 0 | OVS2 | 14 |
| PID Tmr Compare_3 | 0 | 0 | 1 | 1 | 1 | 1 | TA3 | 15 |
| CPU Tmr Compare_3 | 0 | 1 | 0 | 0 | 0 | 0 | TB3 | 16 |
| Tmr OverFlow_3 | 0 | 1 | 0 | 0 | 0 | 1 | OV3 | 17 |
| CPU TmrS Compare_3 | 0 | 1 | 0 | 0 | 1 | 0 | TC3 | 18 |
| TmrS OverFlow_3 | 0 | 1 | 0 | 0 | 1 | 1 | OVS3 | 19 |
| PID Tmr Compare_4 | 0 | 1 | 0 | 1 | 0 | 0 | TA4 | 20 |
| CPU Tmr Compare_4 | 0 | 1 | 0 | 1 | 0 | 1 | TB4 | 21 |
| Tmr OverFlow_4 | 0 | 1 | 0 | 1 | 1 | 0 | OV4 | 22 |
| CPU TmrS Compare_4 | 0 | 1 | 0 | 1 | 1 | 1 | TC4 | 23 |
| TmrS OverFlow_4 | 0 | 1 | 1 | 0 | 0 | 0 | OVS4 | 24 |
| PID Tmr Compare_5 | 0 | 1 | 1 | 0 | 0 | 1 | TA5 | 25 |
| CPU Tmr Compare_5 | 0 | 1 | 1 | 0 | 1 | 0 | TB5 | 26 |
| Tmr OverFlow_5 | 0 | 1 | 1 | 0 | 1 | 1 | OV5 | 27 |
| CPU TmrS Compare_5 | 0 | 1 | 1 | 1 | 0 | 0 | TC5 | 28 |
| TmrS OverFlow_5 | 0 | 1 | 1 | 1 | 0 | 1 | OVS5 | 29 |
| PID Tmr Compare_6 | 0 | 1 | 1 | 1 | 1 | 0 | TA6 | 30 |
| CPU Tmr Compare_6 | 0 | 1 | 1 | 1 | 1 | 1 | TB6 | 31 |
| Tmr OverFlow_6 | 1 | 0 | 0 | 0 | 0 | 0 | OV6 | 32 |
| CPU TmrS Compare_6 | 1 | 0 | 0 | 0 | 0 | 1 | TC6 | 33 |
| TmrS OverFlow_6 | 1 | 0 | 0 | 0 | 1 | 0 | OVS6 | 34 |
| PID Tmr Compare_7 | 1 | 0 | 0 | 0 | 1 | 1 | TA7 | 35 |
| CPU Tmr Compare_7 | 1 | 0 | 0 | 1 | 0 | 0 | TB7 | 36 |
| Tmr OverFlow_7 | 1 | 0 | 0 | 1 | 0 | 1 | OV7 | 37 |
| CPU TmrS Compare_7 | 1 | 0 | 0 | 1 | 1 | 0 | TC7 | 38 |
| TmrS OverFlow_7 | 1 | 0 | 0 | 1 | 1 | 1 | OVS7 | 39 |
| PID Tmr Compare_8 | 1 | 0 | 1 | 0 | 0 | 0 | TA8 | 40 |
| CPU Tmr Compare_8 | 1 | 0 | 1 | 0 | 0 | 1 | TB8 | 41 |
| Tmr OverFlow_8 | 1 | 0 | 1 | 0 | 1 | 0 | OV8 | 42 |
| CPU TmrS Compare_8 | 1 | 0 | 1 | 0 | 1 | 1 | TC8 | 43 |
| TmS OverFlow_8 | 1 | 0 | 1 | 1 | 0 | 0 | OVS8 | 44 |
| PID Tmr Compare_9 | 1 | 0 | 1 | 1 | 0 | 1 | TA9 | 45 |
| CPU Tms Compare_9 | 1 | 0 | 1 | 1 | 1 | 0 | TB9 | 46 |
| Tmr OverFlow_9 | 1 | 0 | 1 | 1 | 1 | 1 | OV9 | 47 |
| CPU TmrS Compare_9 | 1 | 1 | 0 | 0 | 0 | 0 | TC9 | 48 |
| TmrS OverFlow_9 | 1 | 1 | 0 | 0 | 0 | 1 | OVS9 | 49 |
| PID Tmr Compare_10 | 1 | 1 | 0 | 0 | 1 | 0 | TA10 | 50 |
| CPU Tmr Compare_10 | 1 | 1 | 0 | 0 | 1 | 1 | TB10 | 51 |
| Tmr OverFlow_10 | 1 | 1 | 0 | 1 | 0 | 0 | OV10 | 52 |
| CPU TmrS Compare_10 | 1 | 1 | 0 | 1 | 0 | 1 | TC10 | 53 |
| TmrS OverFlow_10 | 1 | 1 | 0 | 1 | 1 | 0 | OVS10 | 54 |
| OR Event_1 (OR0 in PSG.dsn) | 1 | 1 | 0 | 1 | 1 | 1 | OR1 | 55 |
| OR Event_2 (OR1 in PSG.dsn) | 1 | 1 | 1 | 0 | 0 | 0 | OR2 | 56 |
| OR Event_3 (OR2 in PSG.dsn) | 1 | 1 | 1 | 0 | 0 | 1 | OR3 | 57 |
| AND Event_1 (AND0 in PSG.dsn) | 1 | 1 | 1 | 0 | 1 | 0 | AND1 | 58 |
| AND Event_2 (AND1 in PSG.dsn) | 1 | 1 | 1 | 0 | 1 | 1 | AND2 | 59 |
| AND Event_3 (AND2 in PSG.dsn) | 1 | 1 | 1 | 1 | 0 | 0 | AND3 | 60 |
| Disable Internal Events | 1 | 1 | 1 | 1 | 1 | 1 | Int_DE | 61 |
| Disable Internal Events | 1 | 1 | 1 | 1 | 1 | 1 | Int_DE | 62 |
| Disable Internal Events | 1 | 1 | 1 | 1 | 1 | 1 | Int_DE | 63 |

In Table 3, in the "symbol" column TA(i) is TA_i, OV(i) is OV_i, TB(i) is TB_i., TC(i) is, TC_i and OVS(i) is OVS_i. ("i" is order number of PSG channel).
OR1 (OR Event_1) is the first gated event generated by a first OR gate.
OR2 (OR Event_2) is the second gated event generated by a second OR gate.
OR3 (OR Event_3) is the third gated event generated by a third OR gate.
AND1 is the fourth gated event generated by a first AND gate.
AND2 is the fifth gated event generated by a second AND gate.
AND2 is the sixth gated event generated by a third AND gate.

Table 4 shows the order number of external events (0 to 27) and gated events (28, 29) for selection by LUT_i 218 as external event.

TABLE 4

External Events

| | LUT bits | | | | | | Order |
|---|---|---|---|---|---|---|---|
| Internal event name | b15 | b14 | b13 | b12 | b11 | Symbol | No |
| Analog Compare Rise1 | 0 | 0 | 0 | 0 | 0 | EVR0 | 0 |
| Analog Compare Fall 1 | 0 | 0 | 0 | 0 | 1 | EVF0 | 1 |
| Analog Compare Rise2 | 0 | 0 | 0 | 1 | 0 | EVR1 | 2 |
| Analog Compare Fall 2 | 0 | 0 | 0 | 1 | 1 | EVF1 | 3 |
| Analog Compare Rise3 | 0 | 0 | 1 | 0 | 0 | EVR2 | 4 |
| Analog Compare Fall 3 | 0 | 0 | 1 | 0 | 1 | EVF2 | 5 |
| Analog Compare Rise4 | 0 | 0 | 1 | 1 | 0 | EVR3 | 6 |
| Analog Compare Fall 4 | 0 | 0 | 1 | 1 | 1 | EVF3 | 7 |
| Analog Compare Rise5 | 0 | 1 | 0 | 0 | 0 | EVR4 | 8 |
| Analog Compare Fall 5 | 0 | 1 | 0 | 0 | 1 | EVF4 | 9 |
| Analog Compare Rise6 | 0 | 1 | 0 | 1 | 0 | EVR5 | 10 |
| Analog Compare Fall 6 | 0 | 1 | 0 | 1 | 1 | EVF5 | 11 |
| Analog Compare Rise7 | 0 | 1 | 1 | 0 | 0 | EVR6 | 12 |
| Analog Compare Fall 7 | 0 | 1 | 1 | 0 | 1 | EVF6 | 13 |
| Analog Compare Rise8 | 0 | 1 | 1 | 1 | 0 | EVR7 | 14 |
| Analog Compare Fall 8 | 0 | 1 | 1 | 1 | 1 | EVF7 | 15 |
| Schmit Triger Compare Rise 1 | 1 | 0 | 0 | 0 | 0 | EVR8 | 16 |
| Schmit Triger Compare Fall 1 | 1 | 0 | 0 | 0 | 1 | EVF8 | 17 |
| Schmit Triger Compare Rise 2 | 1 | 0 | 0 | 1 | 0 | EVR9 | 18 |
| Schmit Triger Compare Fall 2 | 1 | 0 | 0 | 1 | 1 | EVF9 | 19 |
| Schmit Triger Compare Rise 3 | 1 | 0 | 1 | 0 | 0 | EVR10 | 20 |
| Schmit Triger Compare Fall 3 | 1 | 0 | 1 | 0 | 1 | EVF10 | 21 |
| Schmit Triger Compare Rise 4 | 1 | 0 | 1 | 1 | 0 | EVR11 | 22 |
| Schmit Triger Compare Fall 4 | 1 | 0 | 1 | 1 | 1 | EVF11 | 23 |
| Schmit Triger Compare Rise 5 | 1 | 1 | 0 | 0 | 0 | EVR12 | 24 |
| Schmit Triger Compare Fall 5 | 1 | 1 | 0 | 0 | 1 | EVF12 | 25 |
| Schmit Triger Compare Rise 6 | 1 | 1 | 0 | 1 | 0 | EVR13 | 26 |
| Schmit Triger Compare Fall 6 | 1 | 1 | 0 | 1 | 1 | EVF13 | 27 |
| OR Event_1 (OR0 in PSG.dsn) | 1 | 1 | 1 | 0 | 0 | OR1 | 28 |
| AND Event_1 (AND0 in PSG.dsn) | 1 | 1 | 1 | 0 | 1 | AND1 | 29 |

In Table 4:
EVRi is the external event from the output of the digital filter 204 dictated by the rise edge of the external event received by the digital filter ("i" changes from 0 to 13).
EVFi is the external event from the output of digital filter 204 dictated by the fall edge of the external event received by digital filter 204 ("i" changes from 0 to 13).
OR1 (OR Event_1) is the first gated event generated by an OR gate (one of three).
AND 1 is the first gated event generated by an AND gate (one of three).
Analog Compare Rise(i) is the external event dictated by the rise edge of the analog comparator output signal ("i" changes from 0 to 8).
Analog Compare Fall(i) is the external event dictated by the fall edge of the analog comparator output signal ("i" changes from 0 to 8).
Schmit Triger Compare Rise(i) is the external event dictated by the rise edge of the Schmit Triger output signal ("i" changes from 0 to 6).
Schmit Triger Compare Fall(i) is the external event dictated by the fall edge of the Schmit Triger output signal ("i" changes from 0 to 6).
Double Pulse Sequence Generation (Double Scenario)

The configuration of a LUT for generation of a pulse sequence is called a "Scenario". It is possible to configure a LUT for more than one scenario. This option enables to alter the scenario during run time (on the fly). The required condition to enable "double scenario" operation is to have enough space (number of rows) in the LUT(s) for all requested states of the scenarios. The first scenario (Scenario_0) always begins in LUT(s) Row_0. A second scenario can begin in LUT(s) Row_k where k>[last row number of Scenario_0]. Any higher order scenario is possible if the remaining space in the LUT(s) (not used by the lower order scenarios) is enough to implement the requested higher order scenario.

There are 4 possible sources to alter Scenario_0 with a higher order scenario:

1. by CPU
2. by DPLL: a power line Rise zero cross alters Scenario_0 to Scenario_1. A power line Fall zero cross alters Scenario_1 to Scenario_0.
3. by PSG: the selected PSG-output Rise alters Scenario_0 to Scenario_1. The selected PSG-output Fall alters Scenario_1 to Scenario_0.
4. by SPWM: the selected SPWM-output Rise alters Scenario_0 to Scenario_1. The selected SPWM-output Fall alters Scenario_1 to Scenario_0.

The Rise or Fall of the double scenario alternating source is "Only Alternate Request", and the alternation is performed at the end of the executed scenario. The Second Scenario Base Address can be changed during the run time of Scenario_0 in order to replace the second scenario by pointing on New Second Scenario Base Address. Therefore it is impossible to transfer from the executed second scenario directly to a higher order Scenario.

Table 5 shows a Scenario implementation by configuration of 4 LUTs related to 4 PSG Channels.

TABLE 5

| Used Rows only | Row | b17 LAST | b16 ADCR | b15 ExEvent EN_4 | b14 ExEvent EN_3 | b13 ExEvent EN_2 | b12 ExEvent EN_1 | b11 ExEvent EN_0 |
|---|---|---|---|---|---|---|---|---|
| LUT.0 | 0 | 0 | 0 | 1 | 1 | 1 | 1 | 1 |
|  | 1 | 0 | 0 | 1 | 1 | 1 | 1 | 1 |
|  | 2 | 0 | 0 | 1 | 1 | 1 | 1 | 1 |
|  | 3 | 1 | 0 | 1 | 1 | 1 | 1 | 1 |
| LUT.1 | 0 | 0 | 0 | 1 | 1 | 1 | 1 | 1 |
|  | 1 | 0 | 0 | 1 | 1 | 1 | 1 | 1 |
|  | 2 | 0 | 0 | 1 | 1 | 1 | 1 | 1 |
|  | 3 | 1 | 0 | 1 | 1 | 1 | 1 | 1 |
| LUT.2 | 0 | 0 | 0 | 1 | 1 | 1 | 1 | 1 |
|  | 1 | 0 | 0 | 1 | 1 | 1 | 1 | 1 |
|  | 2 | 0 | 0 | 1 | 1 | 1 | 1 | 1 |
|  | 3 | 0 | 0 | 1 | 1 | 1 | 1 | 1 |
|  | 4 | 1 | 0 | 1 | 1 | 1 | 1 | 1 |
| LUT.3 | 0 | 0 | 0 | 1 | 1 | 1 | 1 | 1 |
|  | 1 | 0 | 0 | 1 | 1 | 1 | 1 | 1 |
|  | 2 | 0 | 0 | 1 | 1 | 1 | 1 | 1 |
|  | 3 | 0 | 0 | 1 | 1 | 1 | 1 | 1 |
|  | 4 | 1 | 0 | 1 | 1 | 1 | 1 | 1 |

| Used Rows only | Row | b10 IntEvent EN_5 | b9 IntEvent EN_4 | b8 IntEvent EN_3 | b7 IntEvent EN_2 | b6 IntEvent EN_1 | b5 IntEvent EN_0 |
|---|---|---|---|---|---|---|---|
| LUT.0 | 0 | 0 | 0 | 0 | 0 | 1 | 1 |
|  | 1 | 0 | 0 | 0 | 0 | 0 | 1 |
|  | 2 | 0 | 0 | 0 | 0 | 1 | 1 |
|  | 3 | 0 | 0 | 0 | 0 | 0 | 1 |
| LUT.1 | 0 | 0 | 0 | 0 | 0 | 1 | 1 |
|  | 1 | 0 | 0 | 0 | 0 | 0 | 1 |
|  | 2 | 0 | 0 | 0 | 0 | 1 | 1 |
|  | 3 | 0 | 0 | 0 | 0 | 0 | 1 |
| LUT.2 | 0 | 0 | 0 | 1 | 0 | 1 | 0 |
|  | 1 | 0 | 0 | 1 | 1 | 0 | 1 |
|  | 2 | 0 | 0 | 1 | 0 | 1 | 1 |
|  | 3 | 0 | 0 | 1 | 1 | 0 | 1 |
|  | 4 | 0 | 0 | 0 | 0 | 0 | 1 |
| LUT.3 | 0 | 0 | 0 | 1 | 0 | 1 | 0 |
|  | 1 | 0 | 0 | 1 | 1 | 0 | 1 |
|  | 2 | 0 | 0 | 1 | 0 | 1 | 1 |
|  | 3 | 0 | 0 | 1 | 1 | 0 | 1 |
|  | 4 | 0 | 0 | 0 | 0 | 0 | 1 |

| Used Rows only | Row | b4 TmrS Reset | b3 TmrS Clk EN | b2 Tmr Reset | b1 Tmr Clk EN | b0 Set/Reset | Int. Event | Ext. Event | State |
|---|---|---|---|---|---|---|---|---|---|
| LUT.0 | 0 | 1 | 1 | 0 | 0 | 0 | TC0 | Ext_DE | 0 |
|  | 1 | 0 | 0 | 1 | 1 | 1 | TB0 | Ext_DE | 1 |
|  | 2 | 1 | 1 | 0 | 0 | 0 | TC0 | Ext_DE | 2 |
|  | 3 | 0 | 0 | 1 | 1 | 0 | TB0 | Ext_DE | 3 |
| LUT.1 | 0 | 0 | 0 | 0 | 0 | 0 | TC0 | Ext_DE | 0 |
|  | 1 | 0 | 0 | 0 | 0 | 0 | TB0 | Ext_DE | 1 |
|  | 2 | 0 | 0 | 0 | 0 | 0 | TC0 | Ext_DE | 2 |
|  | 3 | 0 | 0 | 0 | 0 | 1 | TB0 | Ext_DE | 3 |
| LUT.2 | 0 | 0 | 0 | 1 | 1 | 0 | TA2 | Ext_DE | 0 |
|  | 1 | 1 | 1 | 0 | 0 | 0 | TC2 | Ext_DE | 1 |
|  | 2 | 0 | 0 | 1 | 1 | 1 | TB2 | Ext_DE | 2 |
|  | 3 | 1 | 1 | 0 | 0 | 0 | TC2 | Ext_DE | 3 |
|  | 4 | 0 | 0 | 0 | 0 | 0 | TB0 | Ext_DE | 4 |
| LUT.3 | 0 | 0 | 0 | 0 | 0 | 1 | TA2 | Ext_DE | 0 |
|  | 1 | 0 | 0 | 0 | 0 | 0 | TC2 | Ext_DE | 1 |
|  | 2 | 0 | 0 | 0 | 0 | 0 | TB2 | Ext_DE | 2 |
|  | 3 | 0 | 0 | 0 | 0 | 0 | TC2 | Ext_DE | 3 |
|  | 4 | 0 | 0 | 0 | 0 | 1 | TB0 | Ext_DE | 4 |

Note:
It is possible to generate the same drive signal for a Full Bridge but using only 2 PSG channels by using the SPWM Output Port.

It is possible to update the CPU Data at the alternate moment between scenarios. In order to enable this capability, a configuration bit is set (one bit for CPU Data1_i (234 and one bit for CPU Data2_i 236). The requested new CPU data should be sent before the CPU alternating command. The new data will be loaded into the data registers (CPU Data1_i 234, CPU Data2_i 236) at the alternating moment. The alternation occurs after the last row state of the present scenario.

Dithering Logic 220

As mentioned, each PSG channel includes a dithering logic in order to keep 12 bits average resolution at high frequency PSG signals, and to keep 12 bits control accuracy. The PIDF output data is always 12 bits. The achievable PSG signal resolution (without dithering) for a period time (Tperiod or Cycle Time) is:

$$12\text{-}Round((LOG(1/Fclk*2^{\wedge}12/Tperiod,2)+0.5),0)$$

where Fclk is the clock frequency, i.e. =192Mhz. The dithering level ND is $$ND = Round((LOG(1/Fclk*2^{\wedge}12/Tperiod,2)+0.5),0)$$

ND is the number of Least Significant Bits (LSBs) that are not used in direct comparison to the PSG Timer and are used in the dithering process. The highest ND is 5. ND=0 means the dithering process is not executed and all 12 bits Data are used for direct comparison with PSG Timer.

Dithering Function means that in [2^ND] PSG Cycles the TA Event is delayed by One Fclk Time in [ND Data LSBs Value] events, and not delayed in [2^ND−[ND Data LSBs Value]]. If [ND Data LSBs Value] is defined as "VD".

EXAMPLE

PSG Period is 1 microsec and PIDF Data is 1355.
ND=Round((LOG($\frac{1}{192}M*2^{\wedge}12/1u,2$)+0.5),0)=5
1355=0x054B
VD=0xB=11
(2^ND−VD)=2^5−11=21

Figure 6:
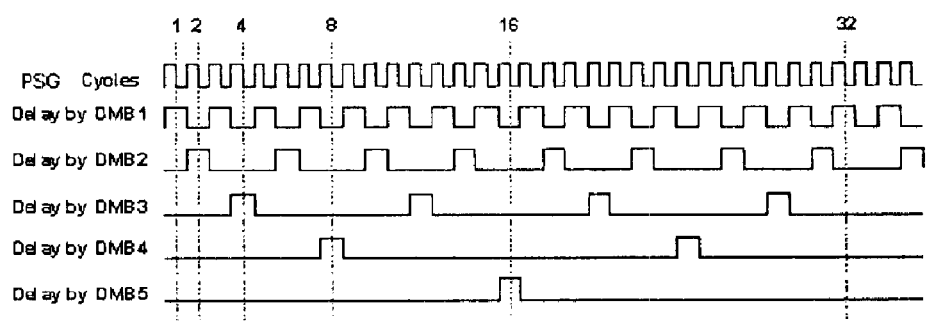
FIG. 6 is an example of a time diagram of signals for dithering logic of the preferred embodiment according to the present invention.

The dithering logic is designed to have maximum scatter of delayed TA events over the 2^ND PSG cycles, in order to minimize the PSG averaging ripple. FIG. 6 shows the dithering principle. In FIG. 6, the first signal is PSG Cycles. The next five signals are DMB1 Delay to DMB5 Delay. These 5 signals are orthogonal, meaning their logic multiplication is zero. The following logic statements represent the dithering algorithm:

DMB1 is the Dithering Most Significant Bit when ND=1.
DMB2 is the Dithering $2^{nd}$ Significant Bit when ND=2.
DMB3 is the Dithering $3^{rd}$ Significant Bit when ND=3.
DMB4 is the Dithering $4^{th}$ Significant Bit when ND=4.
DMB5 is the Dithering $5^{th}$ Significant Bit when ND=5.
DMB1 Delay Signal causes One Clock delay when its level is "1" and if ((ND=1) and DMB1=1)
DMB2 Delay Signal causes One Clock delay when its level is "1" and if ((ND=2) and DMB2=1)
DMB3 Delay Signal causes One Clock delay when its level is "1" and if ((ND=3) and DMB3=1)
DMB4 Delay Signal causes One Clock delay when its level is "1" and if ((ND=4) and DMB4=1)
DMB5 Delay Signal causes One Clock delay when its level is "1" and if ((ND=5) and DMB5=1)

PSG Protection Logic_i 212 enable fast protection to the driven power stage by shut down or turn off for one cycle of the pulse sequence drive signal, in response to an "Out of Limits" sampled analog signal. PSG Protection Logic_212 includes the following inputs: a PSG Timing OUT_I and, a SPWM Timing OUT_i from PSG state machine logic_i 216, an external events input from digital filter 204, and an out of range OURE-IN signal input and AIN input from the ADC scaner. The outputs include a PSG Protection OUT_i and a SPWM Protection OUT_i. The PSG Protection Logic_i performs the following two types of protection: out-of-range and pulse-by-pulse protection.

Out of Range Protection

Each analog input has an "over-digital threshold" configurable value and an "under digital threshold" configurable value. When an analog input exits its thresholds window, the scanner module sends out of range alarm signal together with analog input number (0 to 21 using 5 bits bus) at the sample moment of the related input. Each PSG channel can select 2 analog inputs for out of range protection. A selected out of range alarm is counted by a configurable up prescaler counter once every PSG cycle. The prescaler output increments up/down counter. The up/down counter decrements every configurable number of PSG cycles. When the up/down counter value reaches configurable threshold. A PSG_i protection interrupt request is generated, and if shutdown configuration bit_i is set, PSG_i output is shutdown. the up prescaler counter is incremented only once in a PSG cycle if at least one of the selected protection events happen. A configurable register can select also any external events group as selected protection events.

The number of PSG cycles causing PSG shutdown is according to the following formula:

$$Ncy = M*D/(D/U-1)$$

where: Ncy—number of PSG cycles before shutdown, when at least one selected protection event happens every PSG cycle.
   M—Up/Down Threshold Value
   D—Down Prescaler Value
   D=2 ^VD Where VD is value of 3 configurable bits (0 ... 7)
   U—Up Prescaler Value
   U=2^VU Where VU is value of 3 configurable bits (0 ... 7)
Therefore:

$$Ncy = M*2^{\wedge}VD/(2^{\wedge}(VD-VU)-1)$$

Pulse By Pulse Protection

A configurable bit selects the external events group as a Pulse by Pulse protection event. Any event of the external events group causes PSG Signal Reset until the next PSG Signal Set.

Gated Event Logic 206

The gated event logic generates gated events of two types: "OR" events and "AND" events. An OR event is generated by combinatorial OR of a configurable selection group from the 11 (in this example) PSG Protected OUT_i signals. A configuration bit enables to inverse the OR event to a NOR event. The gated event logic includes 3 configurable mask selector OR gates. An AND event generated by combinatorial AND of a configurable selection group from the same PSG Protected OUT_i signals. A configuration bit enables to inverse the AND event to a NAND event. The gated event logic includes 3 configurable mask selector OR gates. In the particular example, gated event logic 206 includes 11 PSG Protected OUT_i signal inputs and 6 gated outputs.

PSG Other Functions 208

Block 208 performs additional functions including Overlap Protection, Anti Ground Bounce Delay, Chopping, PSG Active Low assignment, and Swap.

Overlap Protection: this function avoids damage to the power circuit caused by forbidden simultaneous conduction of power switches (i.e. half bridge etc.). A forbidden PSG signals overlap is caused by mistaken scenario design. Using the overlap protection configuration, the scenario designer avoids damage caused by his future mistakes in the scenario design.

Anti Ground Bounce Delay: this function is created in order to avoid ground bounce influence on control circuit functioning in extreme conditions of many simultaneously PSG outputs rise or fall together with high capacitance load on PSG output pins. Configuring "1" the anti ground bounce bit, causes [i] Main Clocks delay in the PSG Output_i Signal. The delay time=[i]*5.21 nSec, while [i] is the order number of the delayed PSG Channel.

Figure 7:
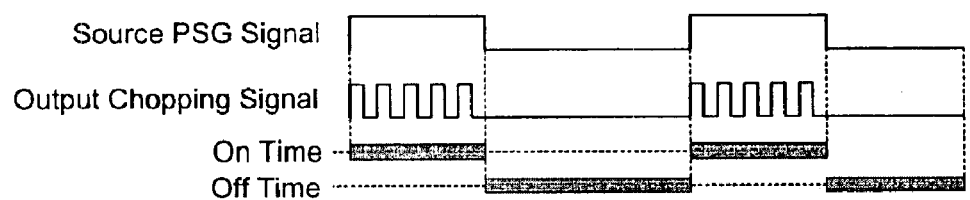
FIG. 7 is an example of a time diagram pulse sequence signal of chopping mode according to the present invention.

Chopping: this function is created for floating drive, using a high frequency drive transformer. When the Chopping Mode Configuration Bit is "1", the Active Time (On Time) of the PSG Signal is chopped by frequency of $Fclk/2^{[VCP]}$, where [VCP]=[3 Chopping Frequency Configuration Bits-value]. FIG. 7 shows the Chopping Function.

PSG Active Low Assignment: this configuration enables to adapt the PSG output polarity to the required polarity of the power switch driver input.

Figure 8:
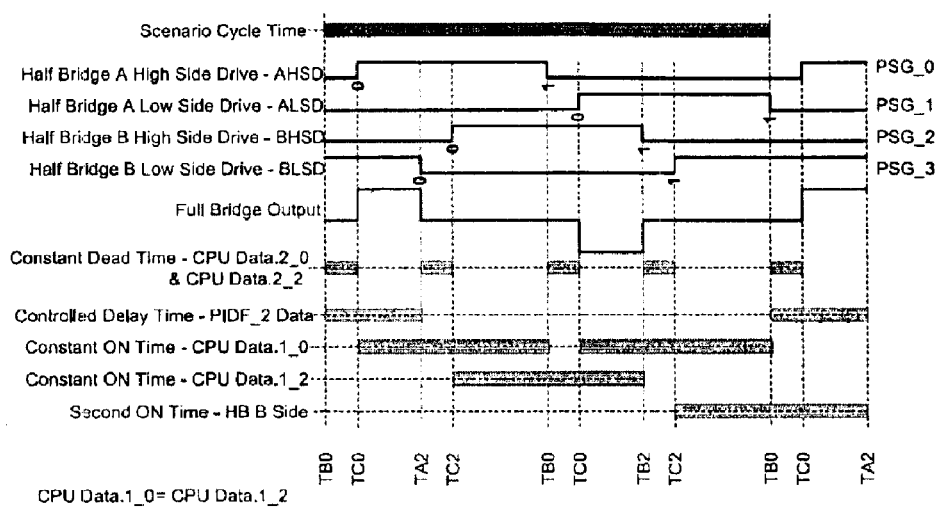
FIG. 8 is an example of a time diagram pulse sequence group for the implementation of a full bridge with phase shift mode according to the present invention.

FIG. 8 shows an exemplary time diagram of a pulse sequence group for implementation of a Full bridge with phase shift mode.

The PIDF Module

The PIDF (Proportional, Integral, Differential and Feed Forward) module is the co-processing engine element that controls the loop and defines/calculates the PSG modulation values. The function of the PIDF Module is to calculate the required data input to the PSG module in a digital controlled loop. As mentioned, a PIDF module contains "i" PIDF channels, where i is an integer equal to or greater than 1. Preferably, in a present architecture, the PIDF module contains 11 identical PIDF Channels (i=[0 to 10]). More generally, the number "i" of channels is identical to the number of loops operative by the IDC PIDF module (additional control loops can be created by configuring the PIDF using a set of constants stored in the flash memory or other memory and feed by the CPU). This number is not meant to be limited to 11, and may in fact be unlimited subject to physical and other system constraints.

Figure 9:
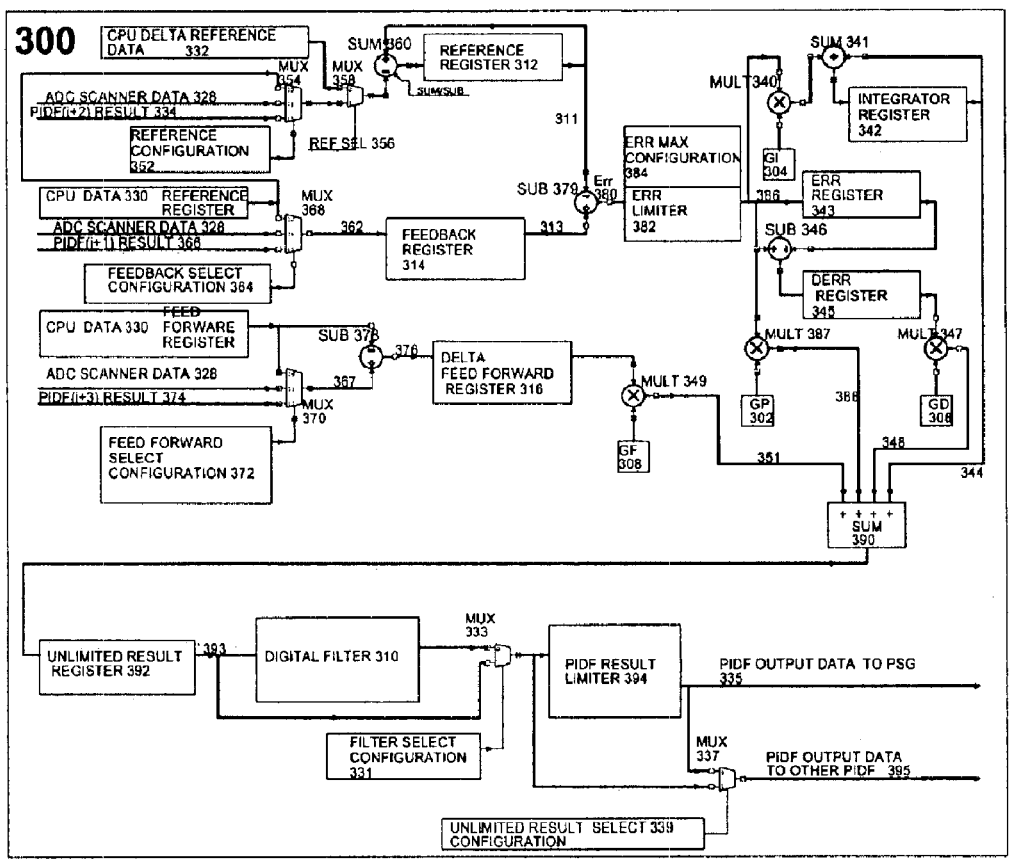
FIG. 9 shows a block diagram of a preferred embodiment of the PIDF module of the present invention.

FIG. 9 depicts a block diagram of a PIDF_i 300. PIDF_i channel 300 comprises at least one proportional gain element GP 302 and at least one integral gain element GI 304. Optionally and additionally, PIDF_i 300 further comprises at least one differential gain element, GD 306. Optionally, PIDF_i 300 further comprises at least one feed forward gain element GF 308. All gain elements are reprogrammable on the fly. The PIDF further includes a digital filter 310 at the output, and various registers discussed below.

FIG. 9 also shows the inputs to a PIDF_i channel. These include three Input Data inputs: Reference, Feedback and Feed Forward. The reference 350 is selected by a reference configuration message 352 to a first reference MUX 354 from a variety of sources including a CPU reference 330, first ADC Scanner data 332, and PIDFi+2 result data 334. The selected reference is stored in a reference register 312. If a delta reference mode is chosen by a reference selector 356 to a second MUX 358 and subtracted from the reference previous data in a first reference register 312 by a sum/sub 360, the result is stored back in reference register 312. A feedback 362 is selected by feedback select configuration message 364 to a third MUX 368 from a variety of sources including CPU data 330, ADC Scanner data 332, and PIDFi+1 data 366. The selected feedback is stored in a second feedback register 314. A feed forward 367 is selected by a feedback configuration message 372 to a fourth MUX 370 from a variety of sources including CPU data 330, ADC Scanner data 332, and PIDFi+3 data 374. Selected feed forward 367 is fed to a subtractor 378 that subtracts CPU data 330 from feed forward 367, and the result which is a delta, feed forward 376, is stored in a delta feed forward register 316.

Error data 380 is the result of subtracting a reference value 311 from a feedback value 313 using a subtractor 379. Error 380 is then passed through a configurable limiter 382. A configuration message 384 decides if an err-max 386 will be limited or not. Err-max 386 is then multiplied by proportional reprogrammable on the fly gain GP 302. The result of a multiplier 387 is a proportional component 388. It is then summed by a summer 390 to an unlimited result register 392, which holds PIDF unlimited result 393. Err-max 386 is multiplied by integration gain GI 304 using a multiplier 340. The product of multiplier 340 is integrated to an integration register 342 using a sum 341 adder. An integration component 344 from register 342 is summed by summer 390 to unlimited result register 392.

In the preferred embodiment, the previous error is stored in an error register 343. Using a subtractor 346, it is subtracted from new error value 386. The result is stored in a DERR 345 register and then, using multiplier 347, multiplied by differential gain GD 306. The product is a differential component 348, which is then summed by summer 390 to unlimited result register 392.

In the preferred embodiment, delta feed forward value 376 is multiplied by feed forward gain GF 308 by using multiplier 349. A product 351 is the feed forward component and it is summed by summer 390 to PIDF unlimited result register 392.

The unlimited result 393 from unlimited result register 392 is selected to be filtered or not by digital filter 310 using a configurable message 331 to a MUX 333. The output unlimited result is then applied to a configurable limiter 394. The outcome of the limiter is a limited PIDF data output 335 to be provided to the PSG. Finally, a configuration message 339 to a MUX 337 selects PIDF data 395 to the other PIDFs to be limited or unlimited PIDF data.

The ADC Scanner Module

Figure 10:
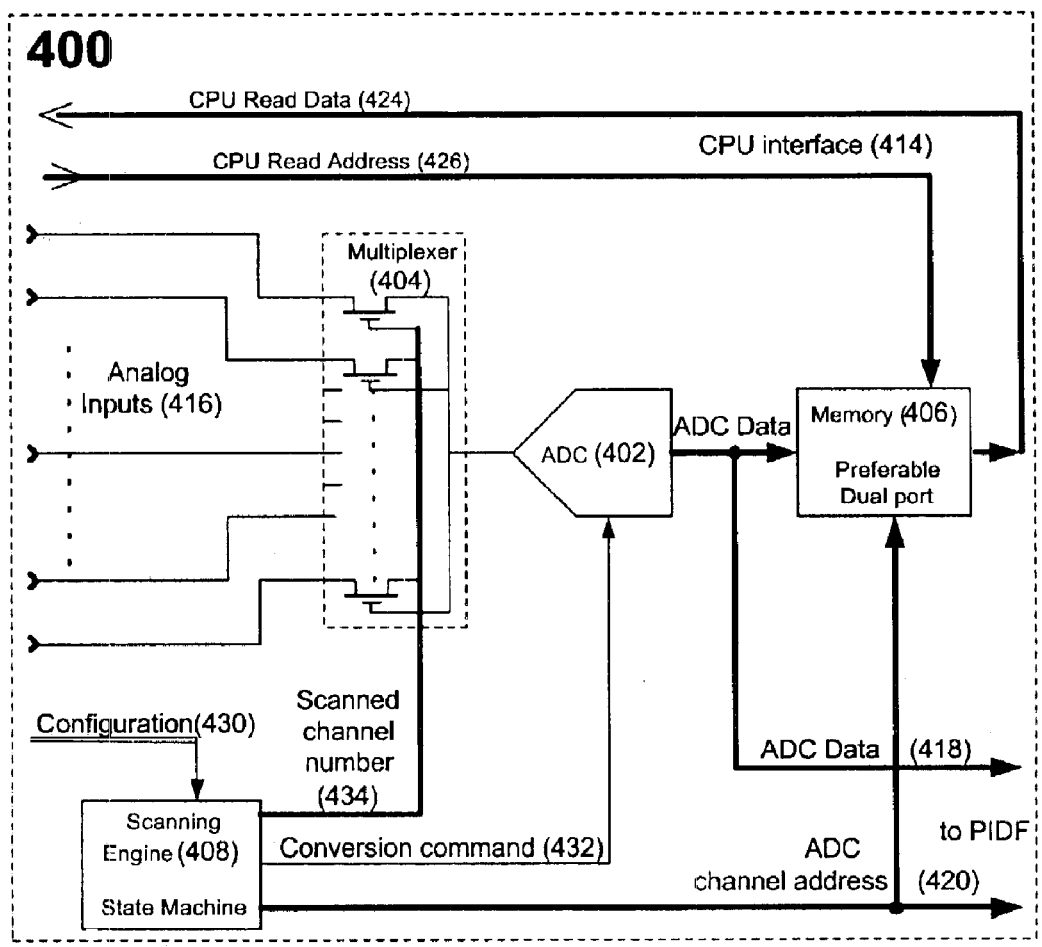
FIG. 10 shows a block diagram of a preferred embodiment of one basic implementation of the ADC Scanner module of the present invention.

The ADC Scanner module is a co-processing engine that provides measurements that are independent of the control loop bandwidth, and is closing a deficiency and inefficiency inherent to the ADC mechanism in general. It is used to digitize analog feedback and analog parameters arriving from the process. It is a RAM based unit that uses an over-sampling method, thus the required signals are stored in a RAM and are ready to be used by the PIDF. Normally, the request for measurement from the ADC involves large time overheads and delays. The ADC Scanner solves this problem by making available into a memory all analog inputs according to their required sample rate. An important innovative feature of the present invention is the speeding up, rationalizing, and optimizing of the ADC resources to maximize the control loop performance. FIG. 10 shows a block diagram; of a preferred embodiment of one basic implementation of the ADC Scanner of the present invention, while FIG. 11 shows a block diagram of a preferred embodiment of another, "extended" implementation of the ADC Scanner with additional optional elements.

A basic ADC Scanner 400 in FIG. 10 comprises the followings functions: an analog to digital converter (ADC) 402, an analog multiplexer (MUX) 404, and a memory 406 for saving the ADC results that interfaces with the CPU through a "CPU interface" 414. ADC Scanner 400 further comprises a state machine element named ADC scanning engine 408 that sends "conversion commands" 432 to ADC 402, and sends data though a "scanned channel number" 434 to MUX 404. Preferably, memory 406 is a dual port RAM, however it can be any other type of memory suitable for the necessary functions. Scanner 400 further includes analog inputs 416 for inputting analog signals to the Scanner. ADC Scanner 400 has a number of analog inputs 416 and digital outputs that connect it to other elements of the IDC and that include: converted data 418 along with an ADC channel address 420 that are fed to the PIDF module, and CPU Read Data 424 along with a CPU Read Address 426 to the CPU. An out-of-range event 422 along with an ADC channel address 420 deliver their data to the PSG module.

Figure 11:
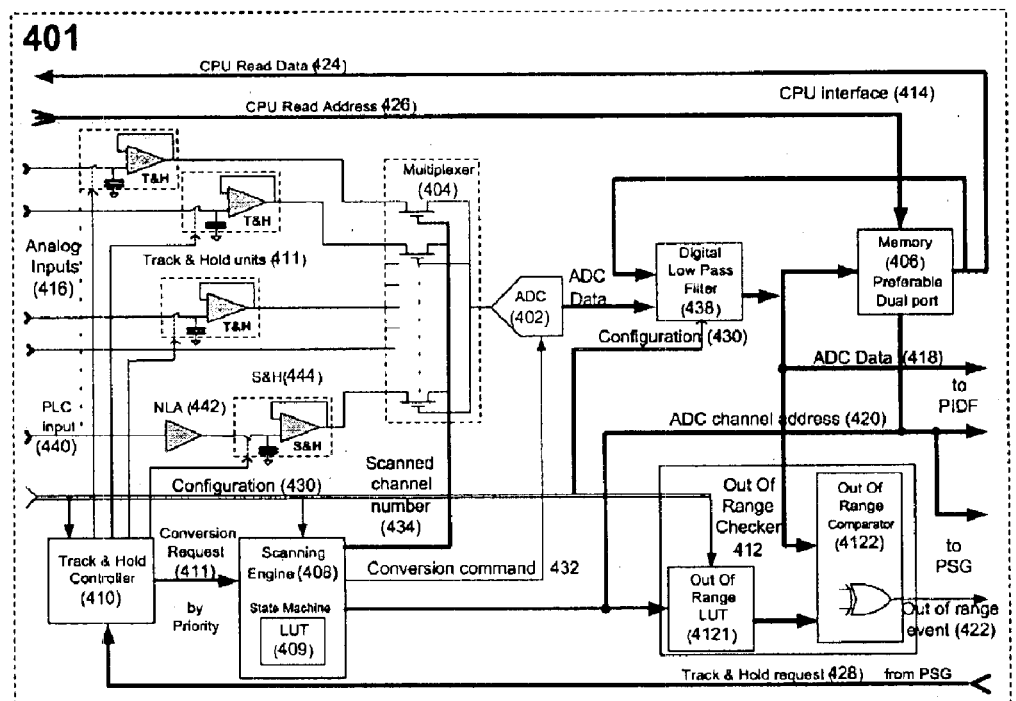
FIG. 11 shows a block diagram of a preferred embodiment of an implementation of the ADC Scanner of the present invention with additional optional elements.

In FIG. 11, an extended ADC Scanner 401 comprises, in addition to the elements listed for ADC Scanner 400 in FIG. 10, a Track and Hold (T&H) controller 410 to allow the Scanner to measure inputs at precise predetermined moment. ADC Scanner 401 further comprises an out-of-range checker 412 that includes an out of range LUT 4121 and an out of range comparator 4122 for providing out of range events to the PSG, and a digital low pass filter 438 in order to filter out noise that can occur as a consequence of sampling analog data in a noisy environment. One of the analog inputs to the ADC Scanner is optional for the receiving of power line carrier (PLC) information. The digitized output is sent to the receiver port of PLC, Communication module 106 in FIG. 1. These are explained now in more detail.

Analog inputs 416 may be connected to MUX 404 either through Track and Hold (T&H) units 411 (FIG. 11) or directly. T&H units 411 may also be bypassed, leaving them under track mode depending the configuration adopted, and the analog input information transferred to multiplexer 404. T&H units 411 are used in the ADC Scanner to allow the Scanner to measure inputs at precise predetermined points. The T&H units set into "Hold" state by a timing-generating device such as the PSG module using a "Track & Hold" request 428, preferably from the PSG. Whenever a channel is set into a "Hold" position, the analog data have to be converted within a certain time because the voltage captured by a T&H units 411 usually degenerates as a function of time. In order to make use of the analog reading held by the T&H units a special ADC conversion is invoked by T&H controller 410 after a channel was set into a "Hold" position. The "Conversion Request" signal is generated by T&H controller 410 and delivered to scanning engine 408.

Scanning engine 408 is configured by the CPU via a configuration 430 bus (FIGS. 10 and 11), which also configures T&H controller 410, out of range checker 412 by means of a LUT, and digital low pass filter 438.

A PLC modem input 440 is connected to ADC 402 via a non-linear amplifier NLA 442 and through a Sample & Hold unit S&H 444. The function of this unit is to provide a steady stream of samples to the PLC receiver. NLA 442 prevents hard clipping and may be switched out.

In the preferred embodiment, ADC Scanner 401 optimizes a sample rate for each input. It has three levels of priority. All the inputs of the highest priority are scanned first, then one input of the second priority is scanned. After completion of a scan for the second priority inputs, one input of the third priority level is scanned. The results of the scan are stored in RAM memory 406, so the results of the scan can be used both by the PIDF engines and the CPU.

In operation, the Scanner scans analog inputs 416 using a command "scanned channel number" 434 according to the pre-programmed sequence that is stored in scanning engine 408, Engine 408 is a state machine configured by a LUT that receives its configuration data via configuration 430 from the CPU. In order to assign different sample rates to different channels according to their bandwidth, and in order to keep the look up table size to a reasonable dimension, a nesting technique is preferably implemented. The data and the channel number are made available to the PIDF instantaneously by reading ADC Data 418 along with ADC channel address 420, and if the channel number matches the required data of a certain PIDF, it is read by it on-the-fly Out of Range Protection Each analog input has a configurable value of over a digital threshold and under a digital threshold. When an analog input exceeds its thresholds window, the Scanner module sends an alarm signal together with this analog input number. The protection option has to be assigned for the appropriate PSG and the numeric limits set by using, configuration 430 bus. Out-of-range checker 412 generates an event signal to be used by the PSG for protection purposes. For those knowledgeable in the art it is obvious that the measurement is relevant only when the T&H is in a Hold position. Therefore a synchronization mechanism is required to ensure that this constraint is met. The T&H function is required whenever the measurement must be performed when a certain event is happening, but the visit time does not coincide with the event because of the sample rate. Thus, the T&H is informed at what time the measurement is required, the T&H is frozen at that time, and the measurement is done when it is due, measuring the parameter at the correct time. The fact that we are using the entire capacity of the ADC, allows to perform over-sampling that results (by adding an averaging element) in the improvement of the measurement signal-to-noise (S/N).

The Analog Compare Module

Figure 12:
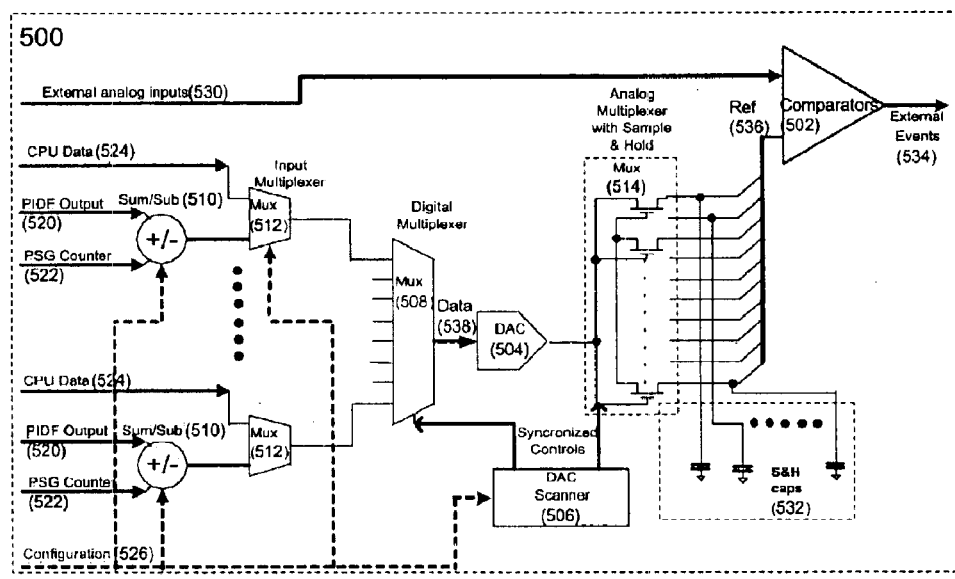
FIG. 12 shows a block diagram of a preferred embodiment of the Analog Compare module of the present invention.

FIG. 12 shows a block diagram of a preferred embodiment of an Analog Compare module 500 according to the present invention. Module 500 includes external analog inputs 530, which are connected in parallel to the ADC Scanner analog inputs, and both may be used simultaneously. Module 500 also includes one or more comparators 502. The comparators in the module have two functions; one is to generate "external analog events" 534, and the other is to perform a current loop control. Each comparator has an individual reference port Ref 536 which is controlled by a digital to analog converter (DAC) 504. In order to minimize silicon area, all the reference ports of the comparators are controlled by a single DAC. The comparators can be also used for a Current Mode Power Supply. For this application, the reference terminal of a comparator is fed with a signal that is a combination of a PIDF output and a saw-tooth waveform that is digitally generated by the PSG.

The reference inputs of the comparators are individually controlled by DAC 504. That function is performed by applying a scanning regime. A DAC Scanner 506 steers digital data 538 into the input of DAC 504, and dispatches the analog outcome through an analog multiplexer (MUX) 514 with sample and hold (S&H). MUX 514 is connected with optional S&H capacitors 532 to the various comparators 502. The data to DAC 504 comes from two sources; one source is a port of the CPU feed by the CPU data 524 line and it is mainly use to apply a constant reference voltage (DC). The other source is a combined data from a PIDF output 520 and a digital saw-tooth 522 that is generated at the PSG. The summation of output 520 and a saw-tooth 522 is performed by an adder/substractor Sum/Sub 510. DAC Scanner 506 typically operates in a similar sequence to ADC scanning engine 408 in FIGS. 10 and 11, which means that it has three levels of priority. DAC 504 enables flexible referencing for the comparators. DAC Scanner 506 allows the use of only one DAC element (instead of many).

An input multiplexer MUX 512 is used in order to decide by a configuration 526 whether to use CPU Data 524 or the product of Sum/Sub 510 as the source for the reference of comparators 502. DAC 504 is used to convert the chosen digital reference into analog reference for the comparators 502. In prior art, the DAC is used as an accurate current or voltage source to be used by an element external to a integrated circuit chip. Those knowledgeable in the art will notice that in the present invention, the DAC is used to create a flexible reference (e.g. a dynamic reference to close a current loop with the PIDF) to improve the control qualities of certain control topologies, applicable to a wide range of applications.

In the preferred embodiment, an economical approach is used in order to reduce silicon area of the IDC by using only one DAC 504 instead of many. DAC Scanner 506, which controls synchronously a digital MUX 508 and analog MUX 514, is used in order to choose between the outputs of MUX 512. The analog outcome of the scanned DAC through Mux 514 together with the optional S&H capacitors 532 is used to memorize the analog outcome signal level. This outcome is applied as reference to Ref 536 terminals of one or more comparators 502, to be compared to external analog inputs 530. The outputs of comparators 502 are used as "external events" 534 for the PSG module or for Current mode control.

The DPLL Module

The purpose of the Phase Locked Loop (PLL) function of the present invention is to provide zero crossing information of the mains voltage in order to serve as a synchronization signal to a number of devices that are connected to the mains. The DPLL also provides programmable accurate time marks within a sine; cycle. This feature is of utmost importance in UPS control applications. This represents a very accurate synchronization and time marking signal for all practical purposes.

The present invention is related to the realization of a PLL that is totally digital. In the existing art, the PLL realization (or at least its voltage controlled oscillator or "VCO" portion) is analog. The advantage of a digital implementation is that the digital algorithm is absolute in its definition, therefore each device that is working with the same algorithm will provide identical synchronization signals. This contrasts with an analog solution, in which the accuracy of the PLL is dependent on components such as resistors and capacitors, which have parameter dispersions that translate into synchronization inaccuracies. The invention of the digital PLL is therefore a solution that is repeatable, robust and low cost for synchronization via the mains. Those knowledgeable in the art understand that the invention can be applied to solve other problems having similar requirements. For example, a UPS is supplying 110 volts 60 Hz when the mains are lost. When the mains return, the UPS and the mains are not synchronized. The digital PLL in the UPS will detect the mains zero crosses, and will smoothly shift the UPS phase to the returned mains phase. This is of course one specific application of many others possible.

Figure 13:
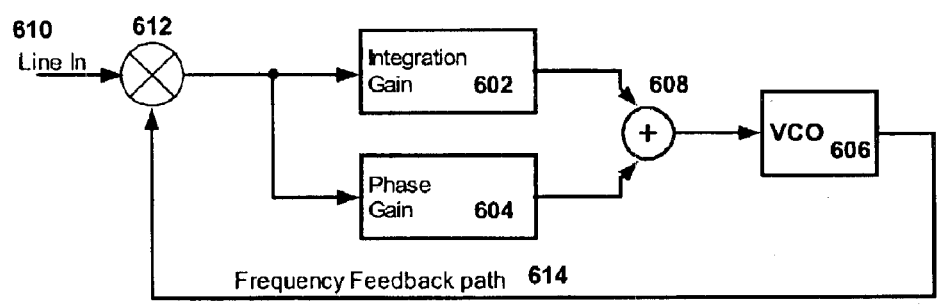
FIG. 13 shows a typical structure of a conventional simple analog PLL.
Figure 14:
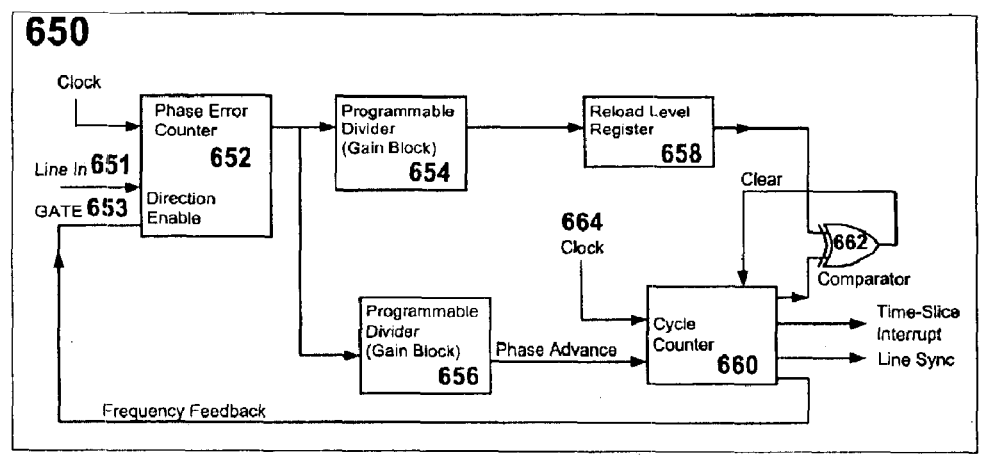
FIG. 14 shows a preferred embodiment of a basic digital implementation of a DPLL according to the present invention.

A typical structure of a conventional simple analog PLL is shown in FIG. 13. It includes the following blocks: an integration gain block 602, a phase gain block 604, a voltage controlled oscillator (VCO) 606, an adder 608, a "Line in" 610 signal, a multiplier 612 and a frequency feedback path 614. Since a VCO cannot be implemented digitally, a digital PLL has to be constructed in a different manner FIG. 14 shows a preferred embodiment of a basic digital implementation of a PLL according to the present invention, using a phase error counter that operates as a quadrature detector; A DPLL 650 comprises a phase error counter block 652, two programmable dividers 564 and 656, a reload register 658, a cycle counter 660 (which functions as a quasi-VCO) and a digital comparator 662 that reloads the cycle counter (which outputs the Gate signal 653 that is the synchronized, outcome of the PLL). The phase error counter serves in the digital implementation as a digital phase comparator. Gate signal 653 identifies a window in which the phase is tested. Whenever the transition of a "Line in" 651 occurs inside that window, the phase error counter counts the clock pulses and measures the time of the event. The Line Sync is an interrupt to the CPU in order to synchronize various SW routines. The counter is incremented at the time that the "Line" is "HIGH", and it is decremented at the time that the "Line" is "LOW". Thus the output of this counter represents the "Phase Error".

The quasi-VCO is implemented by cycle counter 660. This is a counter reloaded to zero by a comparator 662 when the count reaches the level stored in reload level register 658. It is the VCO reference level and it determines the frequency of the VCO. The value stored in that register is dependent of the phase error. This register serves also as an integrator. A "Phase Advance" is accomplished by immediate incrementing cycle counter 660 with a value proportional to the phase error. In order to close the loop, the cycle counter generates Gate signal 653 via the frequency feedback path from 660 to 652.

The entire DPLL may advantageously have more implementations. The cycle counter can be implemented also by a negative logic, which means a "Down" counter that decrements toward zero, and is then reloaded to the value stored in reload level register 658. For practical reasons the "Gain" is smaller than 1, therefore the "Gain Blocks" are implemented by "Digital Divider Blocks" programmable dividers 654 and 656, see FIG. 14

Figure 15:
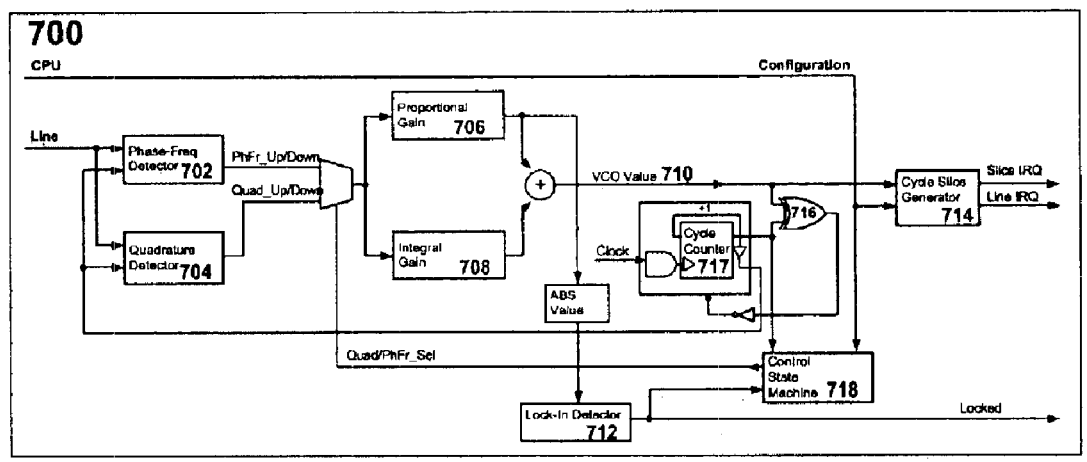
FIG. 15 shows a block diagram of an expanded implementation of a preferred embodiment of the DPLL of the present invention including optional elements.
Figure 16:
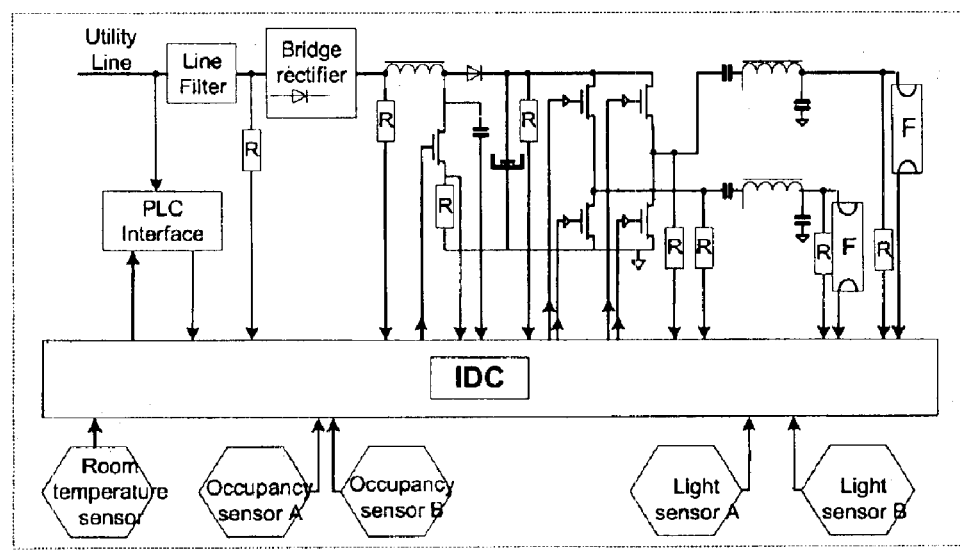
FIG. 16 shows a block diagram of a exemplary application for dimmable electronic ballast.
Figure 17:
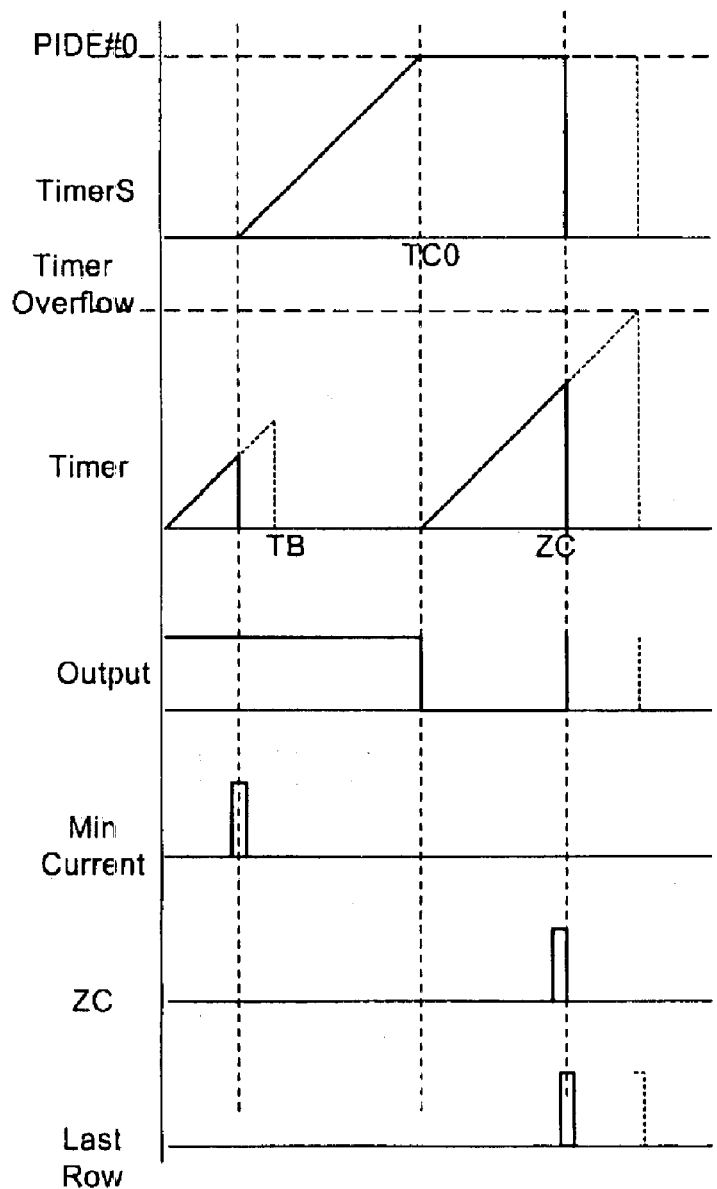
FIG. 17 shows an example of a brief part of the PSG Scenario definition belonging to the PFC function stage of a dimmable electronic ballast.

FIG. 15 shows a block diagram of an expanded implementation of a preferred embodiment of the DPLL of the present invention using a quadrature detector, which is preferably implemented in an IDC chip. A DPLL 700 comprises a phase-frequency detector 702 a quadrature-phase detector 704, a proportional gain block 706, a controlled gain integrator 708, a "VCO function" (the device itself functions as a VCO but it is not) Value 710, a lock-in detector 712, a cycle slice generator 714, and, optionally, a Control State Machine 718. The role and function of each is described next.

Phase-Frequency Detector 702. The phase-frequency detector is a digital phase detector that measures the phase difference and the "order" of the appearance of the phases. The pull-in of this kind of detector is very large, therefore it is used to achieve the initial lock-in function. This kind of detector cannot do the function of noise reduction, because it is sensitive to noise spikes. These spikes have to be filtered out in order to lock-in into the correct frequency. This filtering action causes a significant, unpredictable phase error. Therefore this phase detector is suitable for lock in processes only. The phase error that such a "Spike" filter will introduce is unpredictable (noise dependent). Therefore at a noisy environment the PLL will lock-up but the phase error is inconsistent. This inconsistent is eliminated, by using the quadrature phase detector 704.

Quadrature-Phase Detector 704. The quadrature phase detector is used after the initial lock-in process is completed. It is not capable of locking-in because it is sensitive to sub-harmonics, and cannot do the lock-in process. It functions basically as a digital multiplier, and it does not need an anti-spike filter because on the average the influence of spikes is insignificant. Its filtering ability is a property of the loop itself, and it has the ability to reject noise and to maintain a zero phase error.

Proportional Gain Block 706. Whenever a phase error occurs, the error is amplified by the proportional gain block and is fed into the VCO. As a result, the frequency of the VCO is changed in a direction that causes a reduction in the phase error. The "Proportional Gain" function is performed by the processor to lower silicon resources.

Controlled Gain Integrator 708. A loop that uses solely a proportional gain block, cannot bring the phase error to zero; therefore an integration function is added. The integration function has also a gain element.

This function is also performed by the processor. Both the proportional gain block and the integration gain block determine the dynamic behavior of the loop.

VCO Value 710. In the DPLL, the VCO function is performed by a cycle counter 717 that counts up until it meets a numerical value called "VCO Value", then it reloads to zero using a comparator 716 and starts counting again. The outcome is a cycle with a frequency proportional to the 1/(VCO Value).

Lock-In Detector 712. The lock-in detector has two roles; one is to switch over the phase detectors once the lock-in process was completed, and the other is to notify the processor that the DPLL is ready and functioning. When the lock-in detector is activated for the first time when the phase error generated by the phase-frequency detector is smaller than a predetermined number for a predetermined time. This activation of the lock-in detector causes the PLL to switch over to the quadrature phase detector, and the second activation indicates that the PLL is ready. The Lock-In function is also performed by the processor.

Slice Generator 714. The purpose of the slice generator is to divide the Synchronized cycle into a predetermined number of equal length Slices. This division may be required for two purposes; one purpose is to generate a sine wave using a sine table (whenever the function is necessary), and the other purpose is to make various measurements spread equally over a cycle of the mains (for a UPS application).

In general it is impossible to divide the Synchronized cycle into equal length slices because the division of the total number of clocks in a Cycle by the number of slices will not be an integer. Therefore, in order to divide the Sync cycle into slices, some of the slices have to differ from the others by 1 clock. The slices of N clocks width and the slices of N+1 clock width are spread equally along the cycle. We call this spreading a Dithering. For the preferred embodiment the dithering is accomplished through the process of Interpolation.

Control State Machine 718. This machine is an optional element that comprises registers configured by the CPU to allow to initiate a specific sequence generation of the DPLL process The Configuration Method of the IDC The programmability/configurability of the IDC is achieved by choosing a set of constants and inserting them in the memory of the IDC. The constants are inserted in the CPU 102 memory as separate parameters or as look up table patterns The configurability allows to configure the architecture of the IDC, define the control functions for generic applications, and adapt the control functions/algorithms to allow the generic end-product application, controlled by the IDC, to achieve the particular specifications and performances required by the designer.

The targeted architecture and the control functions/algorithms patterns of the IDC for a particular application are named the "Scenario".

The Scenario defines the following: The I/Os configuration, the time sequence of the output pulses sequences of the PSG channels of PSG module 110, the interconnectivity of the different Custom Logic elements, ADC Scanner 116, PIDF 112, PSG 110 and their channels, including the interconnectivity to the CPU 120 if relevant. It also defines the control function gains of the PIDF 112, the operational function parameters of the Custom Logic and the operational function parameters in This method allows programmability/configurability of the device to a plethora of applications. The definition of the Scenario for the generic application is achieved by defining the individual Scenarios of each of the pertinent Custom Logic elements: PSG 110, PIDF 112, ADC Scanner 116, Analog Compare module 138, DPLL 132, etc. as indicated above. It is also achieved by defining the configuration paths by which these elements are interlaced to the CPU as described in detail for these elements in the present application. This task is carried out by using the proprietary GUI (graphical user interface) that defines the entire set of constants required to define the Scenario by means of look up tables.

Defining the Behavior Parameters of the Control Functions/Algorithms.

Once the Scenario is well defined, the designer can define the constants (parameters) that adapt the control functions/algorithms to the chosen performance of the application defined by the Scenario, and further adapt them to derivatives of the application. This process is carried out also by a proprietary PDK (parameter development kit) GUI tool, and effected in real time when the IDC is connected to the end-product application circuit during its design process or in stand-alone mode. The configuration method of the control functions/algorithms allows the major part of the parameters to be also configured on-the-fly during the process of the design, when the IDC is connected and controls the application prototype, or when working in the final end-product circuit in order to modify the operation mode.

Typically, once the Scenario is created by means of the proprietary GUI tool, and the set of parameters that define the behavior of the control functions are created by means of the PDK, the designer loads the Scenario together with this set of parameters into the IDC device by inserting them in its flash memory by means of a serial port interface (SPI) 146 or by means of another communication interface such as the PLC Communication Modem 106. The (CPU) loads from the IDC memory the configuration constants to all the pertinent elements of the custom logic at initialization and on-the-fly. The on-the-fly reconfiguration is used in order to switch to different modes of operation when required by the circuit of the end-product during its normal operation. The configuration can comprise either the behavior parameters of the control functions and/or the Scenario of the IDC—(refer to the double scenario feature in the above description of the PSG).

The extended configuration capability of the IDC to the targeted application and the programming (definition) method that doesn't need programming of the CPU software as in the conventional DSPs, is also a major advantageous feature of this invention. By example, the PDK application for dimmable electronic ballast has about 70 configurable parameters, and allows the designer to define the complete performance behavior of such an application.

Example of a Power Application Controlled by the IDC

A dimmable electronic ballast application is chosen in order to demonstrate the method of applying the IDC abilities as described above. The system can be divided to 3 independent sub systems that work in parallel:
1. Power Factor Correction (PFC) stage: The input to this stage is the rectified utility line. The output is a regulated DC Bus. "Boost" power topology is used for this stage.
2. Lamp driver stage: The input is the regulated DC Bus. The outputs are 2 current sources for operating 2 different type fluorescent lamps in parallel. A "Half-bridge" power topology is used for this stage together with a resonance circuit as the ballast for the lamp.
3. Communication+commands+sensors: the application will be able to receive a list of commands via Power Line Carrier (PLC) communication and to transmit back acknowledge and status. A variety of sensors will affect the ballast: occupancy sensor, light sensor and lamp temperature sensor.

Table 6 shows application signals and the envelope configuration of the IDC

TABLE 6

1. IDC Output Signals

| Signal | PSG channel Assignment | PSG Timers | PSG int. events |
|---|---|---|---|
| PLC Transmit | PSG 11 | — | — |
| PFC drive | PSG 0 | Timer + TimerS | TA, TB, TC |
| Lamp Driver A HSD | PSG 1 | Timer + TimerS | TA, TB, TC |
| Lamp Driver A LSD | PSG 1 SPWM | TimerS | |
| Lamp Driver B HSD | PSG 2 | Timer + TimerS | TA, TB, TC |
| Lamp Driver B LSD | PSG 2 SPWM | TimerS | |

2: Input Signals

| Signal | Signal type | ADC Scan Priority | Input Assignment | Data/Event/ Message | PIDF/ CPU |
|---|---|---|---|---|---|
| PLC Receive | Analog | 4/5 | PLC Input | PLC Data | Modem |
| Line Phase | Analog | | Comparator #0 | Average phase event | CPU |
| Rectified line shape | Analog | By T&H Request | ADC + T&H CH#1 | Shape Reference Data | CPU |
| PFC switch current | Analog | | Comparator #1 | Current Limit ext. event | — |
| | | | Comparator #2 | Minimum current ext. event | — |
| PFC Zero current | Digital | | Dig. I/O #0 | ZC ext. event | — |
| DC Bus sample | Analog | 1/30 | ADC CH #3 | DC bus Data DC bus Out of range Message | PIDF 0 |
| | | | Comparator #3 | OVP ext. event | — |
| Half bridge A CT Signal | Digital | | Dig. I/O #1 | CTA ext. event | — |
| Half bridge B CT Sig. | Digital | | Dig. I/O #2 | CTB ext. event | — |
| Lamp A Voltage | Analog | 1/30 | ADC CH #4 | Lamp A Volt. Lamp A Out of range message | CPU CPU |
| Lamp A Current | Analog | 1/30 | ADC CH #5 | Lamp A Current. Data | PIDF 1 |
| Lamp B Voltage | Analog | 1/30 | ADC CH #6 | Lamp B Volt. Lamp B Out of range message | CPU CPU |
| Lamp B Current | Analog | 1/30 | ADC CH #7 | Lamp B Current. Data | PIDF 2 |
| Sensor Temperature | Analog | 1/150 | ADC CH #8 | Temp. Data | CPU |
| Sensor Occupancy A | Digital | 1/150 | Dig. I/O #3 | Occup. A Data | CPU |
| Sensor Light A | Analog | 1/150 | ADC CH #9 | Light A Data | CPU |
| Sensor Occupancy B | Digital | 1/150 | Dig. I/O #4 | Occup. B Data | CPU |
| Sensor Light B | Analog | 1/150 | ADC CH #10 | Light B Data | CPU |

CONFIGURATION EXAMPLE

PFC Section

Scenario and Functional Waveforms for Simplified Critical Mode Boost PFC

| CH | Row | Last | T&H | TS RST | TS Enable | T RST | T Enable | Set/ Reset | Internal Event | External Event |
|---|---|---|---|---|---|---|---|---|---|---|
| 0 | 0 | 0 | 0 | 0 | 0 | 1 | 1 | 1 | TB | Min Curr |
| 0 | 1 | 0 | 0 | 0 | 1 | 0 | 0 | 1 | TC | CL |
| 0 | 2 | 1 | 0 | 1 | 0 | 1 | 1 | 0 | T.o.f. | ZC |

In conclusion, the present invention discloses a system and method for digital control of electronic power devices and other systems that require similar control functions. More specifically, the present invention provides the possibility to control, by digital methods and digital means, a large and diverse number of control applications at large bandwidths and with high performance. The system of the present invention provide numerous advantageous features, not known alone or in combination in any prior art system:

Smaller Latency (Delay Time Control): has been reduced to 0.17 µs, as small as 3% of the best digital devices available.

Higher Bandwidth: The IDC can achieve 100 fold the bandwidth of the best competing devices.

Simpler design: Development tools related to the present invention will actually make digital control design simpler and less costly than analog control, without the need of code programming.

Configurable capabilities in a flexible manner by just modifying constants. No analog or existing digital solutions have these attributes.

The PSG, which is an advanced PWM event driven engine. It provides a multi-state period (not possible by analog control). The PSG is driven by a large variety of events (not possible by analog control).

The PIDF, which is a configurable PID engine with feed forward capability. It supports the corresponding PSG or additional PSGs. It includes six, control gains that can be modified on-the-fly, thus providing the PSG an extraordinary flexibility to drive the most complex algorithms.

The method of the present invention has a number of clear advantages over other prior art methods, either used or planned, in that:

It stands within the required clock performance requirements

Has a controlled maximal pointer adjustment rate

Generates minimal erroneous pointer adjustment

Simple to implement in HW or SW

Can support multiple channels with a single simple design.

Same set of parameters is suitable for multiple network conditions and frequency offset of sender.

Stable mechanism that can adapt to changes in network conditions and change of frequency offsets after it has already converged.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

While the invention has been described with respect to a limited number of embodiments, it will be appreciated that many variations, modifications and other applications of the invention may be made.

What is claimed is:

1. An integrated digital controller for controlling electronic devices, comprising:

a. an analog-to-digital converting (ADC) Scanner module configured to flexibly scan analog data inputs and to receive input signals from the analog inputs, the ADC Scanner module operative to create digital data outputs correlated with the input signals;

b. a loop control module for controlling at least one control loop, said loop control module operative to receive said digital data outputs from said analog-to-digital Scanner; and c. a pulse sequence generator (PSG) module used for generating unlimited configurable event-driven pulse sequence groups solely defined by a set of configurable constants, each said group comprising at least one pulse sequence signal, said PSG module operative to provide a plurality of signal modulation modes and to exchange information with said loop control module and said Scanner module;

whereby the integrated digital controller has an architecture that provides practically unlimited control loops that can be implemented in firmware by custom logic, and provides rapid, configurable pulse sequences for a variety of electronic control applications.

2. The integrated digital controller of claim 1, wherein said ADC Scanner module includes:

i. at least one configurable and flexible scan scanning engine responsive to conversion requests and operative to define the sequence of analog-to-digital conversion of said analog inputs, ii. at least one analog multiplexer used to select at least one of said analog inputs using said scanning engine, and iii. at least one analog-to-digital converter for converting said at least one analog input into said digital data outputs.

3. The integrated digital controller of claim 2, wherein said ADC Scanner module further includes an element selected from the group consisting of an out-of-range event generator for generating an out-of-range event, a digital filter for noise rejection and for influencing the dynamics of said controlled loop, a central processing unit (CPU) interface for monitoring and for modifying a configuration on-the-fly according to monitored scanned data, at least one track and hold element for sampling said analog data inputs at a requested precise moment, and a combination thereof.

4. The integrated digital controller of claim 1, wherein each said loop control module includes at least one loop control channel.

5. The integrated digital controller of claim 4, wherein each said loop control channel includes at least one proportional gain element and at least one integral gain element, said at least one proportional and integral elements used to provide a result correlated with at least one control function.

6. The integrated digital controller of claim 5, wherein at least one of said loop control channels further includes at least one additional element selected from the group consisting of at least one differential gain element, at least one feed-forward element, and a combination thereof, said at least one additional element acting coordinately with said at least one proportional gain element and at least one integral gain element to provide an enhanced control function.

7. The integrated digital controller of claim 1, wherein said loop control module can be reconfigured on-the-fly.

8. The integrated digital controller of claim 1, wherein said pulse sequence generator module includes at least one PSG channel.

9. The integrated digital controller of claim 8, wherein each said PSG channel includes at least one state machine for generating at least one of said event-driven pulse sequences, said state machine further including at least one configurable look-up-table for defining said at least one pulse sequence, and a timer for creating at least one internal event used in said generation.

10. The integrated digital controller of claim 9, wherein each said PSG channel further includes at least one element selected from the group consisting of a digital comparator for contributing to the creation of said internal event, an external event input for receiving at least one external event used for said generation and for dictating a transition moment in each said pulse sequence signal, a dithering logic for providing increased resolution of said generated pulse sequence signal, a prescaler used to define a clock frequency used for timing said generation, and a combination thereof.

11. The integrated digital controller of claim 9, wherein each said PSG channel further includes at least one element selected from the group consisting of a high-speed configurable shutdown protection element for shutdown and alarm in response to a configurable selection of events that include out-of-range events and at least one external event, a pulse-by-pulse protection element for immediate shutdown of a pulse for the present cycle using at least one configurable event out of said at least one external event, an output on-the-fly synchronized on/off element for turning on and off said pulse sequence signal, an overlap protection element for preventing cross conduction of power switches due to a design mistake in said pulse sequence configurability, and a combination thereof.

12. The integrated digital controller of claim 9, wherein each said PSG channel further includes at least one element selected from the group consisting of an anti-bounce mechanism for avoiding ground bounce disturbances due to simultaneous transitions in some of said pulse sequence signals, an output port polarity for inverting the polarity of said pulse sequence signal, an output assignment for configuring a port of said PSG, a half bridge mode element for enabling the use of one said state machine for two said outputs of said PSG, and a combination thereof.

13. The integrated digital controller of claim 10, wherein each said PSG channel further includes at least one element selected from the group consisting of a high-speed configurable shutdown protection element for shutdown and alarm in response to a configurable selection of events that include out-of-range events and said at least one external event, a pulse by pulse protection element for immediate shutdown of a pulse for the present cycle using at least one configurable event out of said at least one external event, an output on-the-fly synchronized on/off element for turning on and off said pulse sequence signal, an overlap protection element for preventing cross conduction of power switches due to a design mistake in said pulse sequence configurability, and a combination thereof.

14. The integrated digital controller of claim 10, wherein each said PSG channel further includes at least one element selected from the group consisting of an anti-bounce mechanism for avoiding ground bounce disturbances due to simultaneous transitions in some of said pulse sequence signals, an output port polarity for inverting the polarity of said pulse sequence signal, an output assignment for configuring a port of said PSG, a half bridge mode element for enabling the use of one said state machine for two said outputs of said PSG, and a combination thereof.

15. The integrated digital controller of claim 13, wherein each said PSG channel further includes at least one element selected from the group consisting of an anti-bounce mechanism for avoiding ground bounce disturbances due to simultaneous transitions in some of said pulse sequence signals, an output port polarity for inverting the polarity of said pulse sequence signal, an output assignment for configuring a port of said PSG, a half bridge mode element for enabling the use of one said state machine for two said outputs of said PSG, and a combination thereof.

16. The integrated digital controller of claim 1, implemented in a semiconductor chip.

17. The integrated digital controller of claim 1, further comprising an analog compare module for creating at least one external event to be fed to said PSG module.

18. The integrated digital controller of claim 17, further comprising at least one digital phase locked loop for synchronizing a module selected from the group consisting of said PSG module and said loop control module to said external event.

19. The integrated digital controller of claim 1, further comprising a central processing unit (CPU) used for configuring the controller at initialization and on-the-fly and for managing the controller, and for performing control functions in cooperation with said loop control and said pulse sequence generator modules, said CPU connected to said loop control module and said PSG module by an external data bus and an external address bus.

20. The integrated digital controller of claim 19, further comprising a communication module for a power line carrier (PLC) communication and for radio frequency (RF) communication, said communication module exchanging information with said ADC module and said CPU.

21. The integrated digital controller of claim 20, wherein said communication module includes an external RF tuner for receiving RF signals.

22. A method for digitally controlling electronic power applications comprising the steps of:
 a. providing an integrated digital controller operative to provide configurable, practically unlimited control loops that can be implemented in firmware by custom logic, said controller including at least
  i. an analog-to-digital converting (ADC) Scanner module configured to flexibly scan analog inputs and to receive input signals from said analog inputs and, said ADC Scanner module further configured to create digital data outputs correlated with said input signals;

ii. a pulse sequence generator (PSG) module used for generating, in a plurality of modulation modes, an unlimited number of configurable event-driven pulse sequence groups solely defined by a set of configurable constants, each said group including at least one pulse sequence signal; and iii. a loop control module for controlling at least one control loop, said loop control module configured to receive said digital data outputs from said ADC Scanner and operative to exchange information with said pulse sequence generator; and b. creating rapid, re-configurable pulse sequences for a variety of electronic control applications using said integrated digital controller.

23. An integrated digital controller for controlling electronic devices, comprising:

a. an analog-to-digital converting (ADC) Scanner module operative to flexibly scan analog data inputs and to create digital data outputs correlated with data received from said inputs;

b. a loop control module for controlling at least one control loop, said loop control module operative to receive said digital data outputs from said ADC Scanner;

c. a pulse sequence generator (PSG) module used for generating an unlimited number of configurable event-driven pulse sequence groups solely defined by a set of configurable constants, each said group including at least one pulse sequence signal, said PSG module operative to provide a plurality of signal modulation modes and to exchange information with said loop control module and said Scanner module; and d. an analog compare module for creating at least one external event to be fed to said PSG module.

24. The integrated digital controller of claim 23, implemented in a semiconductor chip.

25. An integrated digital controller for controlling electronic devices, comprising a. an analog-to-digital converting (ADC) Scanner module operative to flexibly scan analog data inputs and to create digital data outputs correlated with data received from said inputs;

b. a loop control module for controlling at least one control loop, said loop control module operative to receive said digital data outputs from said ADC Scanner;

c. a pulse sequence generator (PSG) module used for generating configurable event-driven pulse sequences solely defined by a set of configurable constants, said PSG module operative to exchange information with said loop control module and said Scanner module;

d. an analog compare module for creating at least one external event to be fed to said PSG module; and e. at least one digital phase locked loop for synchronizing a module selected from the group consisting of said PSG module and said loop control module to said external event.

26. The integrated digital controller of claim 25, implemented in a semiconductor chip.

27. An integrated digital controller for controlling electronic devices, comprising:

a. an analog-to-digital converting (ADC) Scanner module operative to flexibly scan analog data inputs and to create digital data outputs correlated with data received from said inputs;

b. a loop control module for controlling at least one control loop, said loop control module operative to receive said digital data outputs from said ADC Scanner c. a pulse sequence generator (PSG) module used for generating configurable event-driven pulse sequences solely defined by a set of configurable constants, said PSG module operative to exchange information with said loop control module and said Scanner module;

d. an analog compare module for creating at least one external event to be fed to said PSG module;

e. at least one digital phase locked loop for synchronizing a module selected from the group consisting of said PSG module and said loop control module to said external event; and f. a central processing unit (CPU) used for configuring the controller at initialization and on-the-fly and for managing the controller and for performing control functions in cooperation with said loop control and said pulse sequence generator, said CPU connected to said loop control module and said PSG module by an external data bus and an external address bus.

28. The integrated digital controller of claim 27, implemented in a semiconductor chip.

29. An integrated digital controller for controlling electronic devices, comprising:

a. an analog-to-digital converting (ADC) Scanner module operative to flexibly scan analog data inputs and to create digital data outputs correlated with data received from said inputs;

b. a loop control module for controlling at least one control loop, said loop control module operative to receive said digital data outputs from said ADC Scanner;

c. a pulse sequence generator (PSG) module used for generating configurable event-driven pulse sequences solely defined by a set of configurable constants, said PSG module operative to exchange information with said loop control module and said Scanner module;

d. an analog compare module for creating at least one external event to be fed to said PSG module;

e. at least one digital phase locked loop for synchronizing a module selected from the group consisting of said PSG module and said loop control module to said external event;

f. a central processing unit (CPU) used for configuring the controller at initialization and on-the-fly and for managing the controller and for performing control functions in cooperation with said loop control and said pulse sequence generator, said CPU connected to said loop control module and said PSG module by an external data bus and an external address bus; and g. a central processing unit (CPU) interface for monitoring and for modifying a configuration on-the-fly according to the scanned data.

30. The integrated digital controller of claim 27, implemented in a semiconductor chip.

31. An integrated digital controller for controlling electronic devices, comprising:

a) a converting mechanism for converting analog data into digital data;

b) a digital calculating mechanism for transforming said digital data into digital input signals; and c) a digital output mechanism operative to use said digital input signals to produce an unlimited number of configurable pulse sequence groups in a plurality of signal modulation modes, each said group including a plurality of configurable cyclic pulse sequence signals having a common cycle time, whereby the integrated digital controller has an architecture that provides practically unlimited control loops that can be implemented in firmware by custom logic, and provides rapid, configurable pulse sequences for a variety of electronic control applications in a plurality of signal modulation modes.

32. The integrated digital controller of claim 31, wherein said digital output mechanism is further operative to provide configurable interdependent timing transitions for pulse sequence signals belonging to a same said pulse sequence group, wherein each said pulse sequence group is further characterized by having a first plurality of segments, each said segment being an interval between any two said timing transitions.

33. The integrated digital controller of claim 32, wherein said plurality of signal modulation modes includes modes selected from the group of pulse width modulation (PWM), frequency modulation (FM) and phase shift modulation (PSM).

34. The integrated digital controller of claim 31, wherein said configurable pulse sequence groups are defined by a set of configurable constants selected from the group of configurable constants obtained from look-up-tables and configurable constants obtained from configurable registers.

35. The integrated digital controller of claim 33, wherein said segments are selected from the group consisting of a cycle time in said FM, an ON pulse width in said PWM, an OFF time leading edge in said PWM and a delay time between two dependent said pulse sequence signals in PSM.

36. The integrated digital controller of claim 34, wherein said controller is further operative to perform on-the-fly alterable scenarios of pulse sequence generation using said configurable constants obtained from look-up tables.

37. The integrated digital controller of claim 31, implemented in a semiconductor chip.

* * * * *

UNITED STATES PATENT AND TRADEMARK OFFICE
CERTIFICATE OF CORRECTION

PATENT NO. : 6,946,984 B2
DATED : September 20, 2005
INVENTOR(S) : Rubin et al.

It is certified that error appears in the above-identified patent and that said Letters Patent is hereby corrected as shown below:

Column 40,
Line 56, "27" should read -- 29 --.

Signed and Sealed this

Seventh Day of March, 2006

JON W. DUDAS
*Director of the United States Patent and Trademark Office*